(12) United States Patent
Mabuchi et al.

(10) Patent No.: US 7,630,794 B2
(45) Date of Patent: Dec. 8, 2009

(54) ISOLATED OPERATION DETECTING METHOD, CONTROL APPARATUS FOR DETECTING ISOLATED OPERATION FOR DISTRIBUTED POWER SUPPLY

(75) Inventors: Masao Mabuchi, Moriyama (JP);
Yasuhiro Tsubota, Moriyama (JP);
Nobuyuki Toyoura, Moriyama (JP);
Seiji Oka, Ritto (JP); Shinichi Hosomi, Otsu (JP); Masaya Kato, Kusatsu (JP);
Kazuyoshi Imamura, Kusatsu (JP)

(73) Assignee: Omron Corporation, Kyoto-Shi (JP)

( * ) Notice: Subject to any disclaimer, the term of this patent is extended or adjusted under 35 U.S.C. 154(b) by 345 days.

(21) Appl. No.: 11/652,644

(22) Filed: Jan. 12, 2007

(65) Prior Publication Data

US 2007/0179724 A1 Aug. 2, 2007

(30) Foreign Application Priority Data

Jan. 13, 2006 (JP) ............................. 2006-006108
Aug. 31, 2006 (JP) ............................. 2006-235572

(51) Int. Cl.
*G05D 3/12* (2006.01)
*G01R 21/00* (2006.01)

(52) U.S. Cl. ........................................ 700/286; 702/60
(58) Field of Classification Search ................. 700/285;
363/39; 361/78; 702/58, 60
See application file for complete search history.

(56) References Cited

U.S. PATENT DOCUMENTS 6,219,623 B1* 4/2001 Wills ........................... 702/60
7,342,758 B2* 3/2008 Liu et al. ...................... 361/62

FOREIGN PATENT DOCUMENTS

| JP | 02-144615 | 6/1990 |
| JP | 08-098411 | 4/1996 |
| JP | P3397912 | 2/2003 |
| JP | P3424443 | 5/2003 |

* cited by examiner

*Primary Examiner*—Albert DeCady
*Assistant Examiner*—Sivalingam Sivanesan
(74) *Attorney, Agent, or Firm*—Foley & Lardner LLP

(57) ABSTRACT

An isolated operation detecting method according to the present invention includes: a first step that injects a power fluctuation into the power system; a second step that measures a system cycle; a third step that adjusts the injection of the power fluctuation so that the system cycle increases when the system cycle is found increased than the previous system cycle as a result of the measuring, and decreases when the system cycle is found decreased than the previous system cycle; a fourth step that produces a change pattern of a latest system cycle on the basis of a deviation of the latest system cycle from a fixed number of cycle-passed previous system cycle; and a fifth step that determines an isolated operation on the basis of the change pattern.

15 Claims, 22 Drawing Sheets

Fig. 3

| Data pieces used by each system cycle | n23 | n22 | n21 | n20 | n19 | n18 | n17 | n16 | n15 | n14 | n13 | n12 | n11 | n10 | n9 | n8 | n7 | n6 | n5 | n4 | n3 | n2 | n1 | n0 |
|---|---|---|---|---|---|---|---|---|---|---|---|---|---|---|---|---|---|---|---|---|---|---|---|---|
| | | Eight cycles out of ten are averaged (Nave) | | | | | | | | | | | | | | | | | | | N3 | N2 | N1 | N0 |

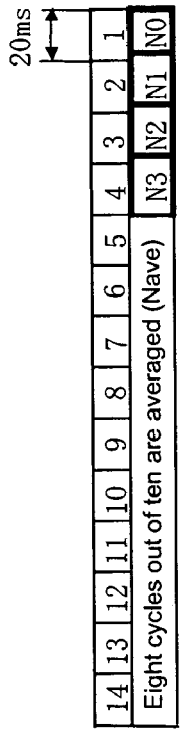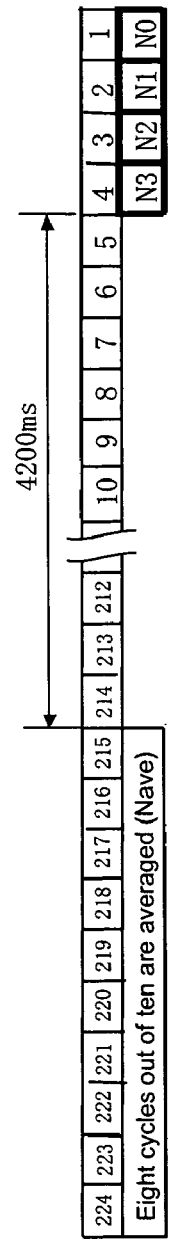
Fig. 4A
Fig. 4B
Fig. 4C

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 |
|----|----|----|----|----|----|----|----|----|----|----|----|----|----|----|---|---|---|---|---|---|---|---|---|
| Eight cycles out of ten are averaged (Nave) | | | | | | | | | | | | | | | | | | | | N3 | N2 | N1 | N0 |

Fig. 15B

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 |
|----|----|----|----|----|----|----|----|----|----|----|----|----|----|----|---|---|---|---|---|---|---|---|---|
| Eight cycles out of ten are averaged (Nave) | | | | | | | | | | | | | | | | | | N5 | N4 | N3 | N2 | N1 | N0 |

Fig. 17A

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 |
|----|----|----|----|----|----|----|----|----|----|----|----|----|----|----|---|---|---|---|---|----|----|----|----|
| Eight cycles out of ten are averaged (Nave) | | | | | | | | | | | | | | | | | | | | N3 | N2 | N1 | N0 |

Fig. 17B

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 |
|----|----|----|----|----|----|----|----|----|----|----|----|----|----|----|---|---|---|---|---|----|----|----|----|
| Eight cycles out of ten are averaged (Nave) | | | | | | | | | | | | | | | | | | Nave5 | Nave4 | Nave2 | Nave3 | Nave1 | Nave0 |

| | High-speed detection (four cycles) | | Sure detection (six cycles) | | Effect | | |
|---|---|---|---|---|---|---|---|
| | Average process: NO | Average process: YES | Average process: NO | Average process: YES | (1) | (2) | (3) |
| Embodiment | ○ | | | | | | |
| Example 1 | | ○ | | | ○ | | |
| Example 2 | ○ | | | | | ○ | |
| Example 3 | | | ○ | | | ○ | |
| Example 4 | | | | ○ | | | ○ |
| Example 5 | | | | ○ | | | ○ |

ISOLATED OPERATION DETECTING METHOD, CONTROL APPARATUS FOR DETECTING ISOLATED OPERATION FOR DISTRIBUTED POWER SUPPLY

This application claims priority from Japanese patent applications 2006-006108 filed Jan. 13, 2006 and 2006-235572 filed Aug. 31, 2006. The entire content of the aforementioned applications are incorporated herein by reference.

BACKGROUND OF THE INVENTION

1. Field of the Invention

The present invention relates to an isolated operation detecting method for detecting whether a distributed power supply is isolatedly operated from an electric system or not on the basis of a power fluctuation injected to the electric system, a control apparatus for detecting isolated operation of a distributed power supply, an isolated operation detecting apparatus, and a distributed power supply.

2. Description of the related arts

An isolated operation refers to a condition in which a distributed power supply supplies electric power to a local load of the system when an electric system stops its operation due to an accident or the like. The continuation of the isolated operation of the distributed power supply greatly affects the safety of human bodies or facilities.

A distributed power supply is installed to a customer place or its neighborhood for generating power. The current mainstream of such distributed power supply includes a cogeneration system using gas turbine, gas engine, solar power, and the like. In addition to these systems, it is expected for the future that a power generation system using renewable energy such as wind power, small-scale hydraulic power, biomass, or the like, or waste materials or the like; micro gas turbine that is technically under developing; or a fuel cell will be spread. Of these, a fuel cell is highly expected to be the mainstream of the distributed power supply, and is considered to be installed not only to a large-scale facility such as a factory but also to a small-scale facility such as ordinary house.

Typical compact distributed power supplies include gas engine, gas turbine, micro gas turbine, solar power, fuel cell, or the like. An electric power company has made an enormous capital investment to build a power station at a place far away from a customer place, and has made a power transmission to the customer place. Such long distance power transmission produces power loss, causing power generation efficiency to be approximately as high as 30%.

In an isolated operation detecting apparatus for detecting an isolated operation for the distributed power supply explained above, various power fluctuation systems such as reactive power fluctuation system, active power fluctuation system, harmonic injection system, or the like have already been proposed as a practical detecting system of the isolated, operation, although the detailed explanation is omitted.

In the detection of the isolated operation in the power fluctuation system described above, it takes 0.5 to 1.0 seconds as isolated operation detecting time to detect the isolated operation when it occurs. However, high-speed detecting technique for shortening this isolated operation detecting time to not more than 0.1 second has been demanded.

FIG. 25 is an imaginary diagram in which multiple distributed power supplies are interconnected. The isolated operation detecting time of a power line conditioner is 0.5 to 1.0 second in the active system. This is a characteristic assuming the isolated operation (i) per each house, and the detecting time was acceptable when distributed power supplies were not widely used. However, as distributed power supplies have become more popular in these days, multiple distributed power supplies have been interconnected as shown in FIG. 25. In this case, the isolated operation may occur (ii) per pole-mounted transformer, (iii) per sectionalizing switch, or (iv) per breaker. When these high-voltage devices are included in isolated operation detecting system, a high-speed detection of the isolated operation is needed assuming an accident caused by contacting high-voltage section and low-voltage section.

There are many techniques relating to the isolated operation. The representative examples relating to the isolated operation are disclosed in Japanese Patent Application Laid-Open No. 02(1990)-144615, Japanese Patent Application Laid-Open No. 08(1996)-98411, Japanese Patent No. 3397912, and Japanese Patent No. 3424443.

However, the subject in the above-mentioned high-speed detection is to prevent misdetection (unnecessary operation) that is erroneously detecting an isolated operation when no isolated operation occurs as explained below. This unnecessary operation is caused by various factors. It has been technically difficult to realize the high-speed detection as well as to prevent the unnecessary operation.

The reason is as follows. Firstly, when current flows through a load, or power-generating current flows from an inverter in a distributed power supply, regional voltage is produced by a resistance component or inductance component of a power line. This voltage fluctuates by a load fluctuation or fluctuation in the output from the distributed power supply, which causes a voltage vector at an incoming terminal to change, whereby seemingly causing a system phase, or a system cycle to be changed. On the other hand, in the power fluctuation system, as a power fluctuation element becomes conspicuous upon an isolated operation, and the isolated operation is detected from the change in the system cycle produced by the conspicuous power fluctuation component, it is difficult to distinguish whether the change in the system cycle is produced by the resistance component or inductance component in the power line or by the isolated operation. Therefore, this often leads to unnecessary operation of erroneously detecting the isolated operation even when no isolated operation occurs.

SUMMARY OF THE INVENTION

Accordingly, an object of the present invention is to make a high-speed detection of an isolated operation possible without causing unnecessary operation.

(1) An isolated operation detecting method according to the present invention for detecting whether a distributed power supply is cut off from a power system and isolatedly operated or not on the basis of a power fluctuation injected into the power system, including: a first step that injects a power fluctuation into the power system; a second step that measures a system cycle; a third step that adjusts the injection of the power fluctuation so that the system cycle increases when the system cycle is found increased than the previous system cycle as a result of the measuring, and decreases when the system cycle is found decreased than the previous system cycle as a result of the measuring; a fourth step that produces a change pattern of a latest system cycle on the basis of a deviation of the latest system cycle from a fixed number of cycle-passed previous system cycle; and a fifth step that determines an isolated operation on the basis of the change pattern.

In the above-mentioned operation, the injection of the power fluctuation in the first step is not limited to be done periodically, but may be optionally, e.g., irregularly, done.

According to the present invention, the power fluctuation is injected into the power system at the first step, the system cycle is measured at the second step, the injection of the power fluctuation is adjusted so that the power fluctuation increases when the system cycle is found increased than the previous system cycle as a result of the measuring, and decreases when the system cycle is found decreased than the previous system cycle at the third step, and the change pattern of the system cycle after the isolated operation is produced at the fourth step on the basis of the deviation between the system cycle after the isolated operation and the system cycle before the isolated operation. Therefore, the system cycle only depends upon the distributed power supply, not the power system, once the isolated operation occurred, and since the power fluctuation is injected into the power line in this case, the system cycle changes according to the power fluctuation. This change is fed back so as to increase the cycle according to the increased change and to decrease the cycle according to the decreased change. Therefore, the change pattern becomes different between during the isolated operation and during the unnecessary operation, whereby even if the system cycle changes on the basis of the load current or power generating current at the distributed power supply, it is possible to prevent the isolated operation from being erroneously detected. Since the detection of the isolated operation is performed by the change pattern formed immediately upon the isolated operation, the high-speed detection of the isolated operation is possible.

(2) One preferable aspect of the present invention is such that the fourth step calculates whether each of the deviations between each of plural latest system cycles and each of a fixed number of cycle-passed previous system cycles exceeds a corresponding one of plural threshold values set for every deviation, and forms the change pattern on the basis of the result of the calculation.

In this aspect, the fixed number of system cycles are interposed between the latest system cycles and the previous system cycles, so that the determination of the isolated operation at the fifth step can more accurately be performed. As a result, both of the high-speed detection and prevention of the misdetection (unnecessary operation) can be achieved.

(3) One preferable aspect of the present invention is such that the interval between the latest system cycles and the previous system cycles is fixed.

(4) One preferable aspect of the present invention is such that the plural deviations are the deviations between each of the plural latest system cycles and an average value of the fixed number of cycle-passed previous system cycles.

In this aspect, since each of the previous system cycles is regarded as the average value of the plural previous system cycles, the determination of the isolated operation at the fifth step can more accurately be performed. As a result, both of the high-speed detection and prevention of the misdetection (unnecessary operation) can be achieved.

(5) One preferable aspect of the present invention is such that the fourth step forms an isolated operation determination area from each of threshold values set corresponding to each of the plural latest system cycles, and wherein the fifth step determines the isolated operation by judging whether the change pattern formed from the plural deviations is within the isolated operation determination area or not.

In this aspect, since the determination of the isolated operation is performed by judging whether the change pattern is within the isolated operation determination area or not, the determination of the isolated operation at the fifth step can more accurately and easily be performed. As a result, both of the high-speed detection and prevention of the misdetection (unnecessary operation) can be achieved.

(6) One preferable aspect of the present invention is such that the threshold value is set to be greater for the most latest system cycle.

In this aspect, the change pattern upon the isolated operation can be made monotonously increased or monotonously decreased since the threshold value is set to increase as the system cycle is the most latest after the isolated operation, while the change pattern upon the unnecessary operation can be made, for example, such that the system cycle firstly increases or decreases, and then vice versa. As a result, both of the high-speed detection and prevention of the misdetection (unnecessary operation) can be achieved.

(7) One preferable aspect of the present invention is such that, in case increased threshold is set, the first threshold value is set to be negative.

(8) One preferable aspect of the present invention is such that, in case decreased threshold is set, the first threshold value is set to be positive.

(9) One preferable aspect of the present invention is such that an average value of the plural latest system cycles is used as each of the latest system cycles.

In this aspect, the isolated operation can be detected even if a frequency of system cycles is changed as being fluctuated upon the isolated operation.

(10) One preferable aspect of the present invention is such that the threshold values are set to slowly increase or decrease compared to system cycles.

In this aspect, the isolated operation can be detected even if the frequency change is gentle.

(11) One preferable aspect of the present invention is such that, in the above-mentioned (9) and (10), each of the threshold values comprises a threshold value determined with a prolonged cycle of more than one latest system cycle.

In this aspect, the unnecessary operation is prevented, and the isolated operation can be detected even if a frequency of system cycles is changed as being fluctuated or the frequency change is gentle upon the isolated operation.

(12) One preferable aspect of the present invention is such that the threshold values comprise a set of threshold values for determining a sharp system cycle change during a short cycle period and a set of threshold values for determining a gentle system cycle change during a long cycle period.

In this aspect, the high-speed detection is possible, and the isolated operation can be detected even if a frequency of system cycles is changed as being fluctuated or the frequency change is gentle upon the isolated operation.

(13) A control apparatus according to the present invention controls an operation of an isolated operation detecting apparatus that detects whether a distributed power supply is cut off from a power system and isolatedly operated or not, including: a first unit that injects a power fluctuation into the power system; a second unit that measures a system cycle; a third unit that adjusts the injection of the power fluctuation so that the system cycle increases when the system cycle is found increased than the previous system cycle as a result of the measuring, and decreases when the system cycle is found decreased than the previous system cycle as a result of the measuring; a fourth unit that producing a change pattern of a latest system cycle on the basis of a deviation of the latest system cycle from a fixed number of cycle-passed previous system cycle; and a fifth unit that determines an isolated operation on the basis of the change pattern.

Since the present invention comprises a configuration for executing the method described in (1), both of the high-speed detection and prevention of the misdetection (unnecessary operation) can be achieved.

(14) One preferable aspect of the present invention is such that the first to the fifth units are distributedly mounted both in the distributed power supply and the isolated operation detecting apparatus.

(15) A control apparatus of the present invention controls an operation of an isolated operation detecting apparatus that detects whether a distributed power supply is cut off from a power system and isolatedly operated or not, comprising incorporated therein a microcomputer including software program executing the method described in any one of (1) to (12).

Since the control apparatus of the present invention executes the method described in any one of (1) to (12), both of the high-speed detection and prevention of the misdetection (unnecessary operation) can be achieved for the isolated operation detecting apparatus.

(16) An isolated operation detecting apparatus according to the present invention detects whether a distributed power supply is cut off from a power system and isolatedly operated or not, and comprises the above-described control apparatus.

(17) A distributed power supply according to the present invention has incorporated therein an isolated operation detecting apparatus that detects whether a distributed power supply is cut off from a power system and isolatedly operated or not, wherein the isolated operation detecting apparatus comprises the above-described control apparatus.

According to the present invention, an isolated operation can be detected with high speed without causing an unnecessary operation.

BRIEF DESCRIPTION OF THE DRAWINGS

FIG. 3 shows a diagram relating to an explanation of the operation of the control apparatus shown in FIG. 1 and illustrating the relationship between the latest system cycle and a previous system cycle;

FIGS. 4A, 4B and 4C show explanatory views about the reason why system cycles n4 to n13 are excluded in FIG. 3;

FIGS. 12A and 12B show diagrams relating to an explanation of the operation of the example 1 and illustrating the relationship between the latest system cycle and a previous system cycle;

FIGS. 15A and 15B show diagrams relating to an explanation of the operation of the example 3 and illustrating the relationship between the latest system cycle and a previous system cycle;

FIGS. 17A and 17B show diagrams relating to an explanation of the operation of the example 4 and illustrating the relationship between the latest system cycle and a previous system cycle;

FIGS. 20A and 20B show diagrams relating to an explanation of the operation of the example 5 and illustrating the relationship between the latest system cycle and a previous system cycle;

FIG. 24 shows a table in which the isolated operation detecting methods of the examples 1 to 5 and their effects are summarized.

DETAILED DESCRIPTION OF THE PREFERRED EMBODIMENT

An isolated operation detecting method, a control apparatus thereof, an isolated operation detecting apparatus, and a distributed power supply according to an embodiment of the present invention will be explained with reference to the appended drawings.

Figure 1:
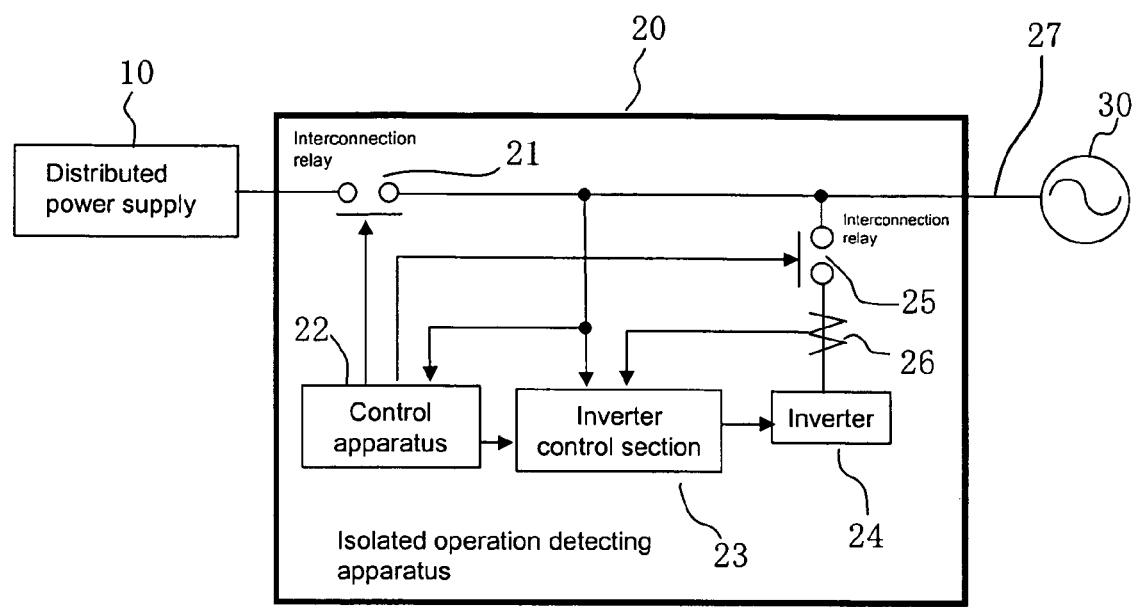
FIG. 1 shows a diagram of a configuration of a power control system composed of a distributed power supply and an isolated operation detecting apparatus, to which an isolated operation detecting method according to the embodiment of the present invention is applied.

FIG. 1 shows a configuration of a power control system provided with a distributed power supply and an isolated operation detecting apparatus. Referring to FIG. 1, numeral 10 denotes a distributed power supply such as a solar cell or fuel cell, numeral 20 denotes an isolated operation detecting apparatus, and numeral 30 denotes a power system.

The isolated operation detecting apparatus 20 has an interconnection relay 21, a control apparatus 22, an inverter control section 23, an inverter 24, an interconnection relay 25, and a current detector 26.

The interconnection relay 21 is disposed on a power line between the distributed power supply 10 and a power system 30.

The control apparatus 22 (hereinafter also referred to as "control apparatus according to the embodiment" for the sake of convenience in the following explanation) includes a microcomputer. It executes, in accordance with a software program, a first step for periodically injecting power fluctuation into the power system, a second step for measuring the system cycle, a third step for adjusting the injection of the power fluctuation so that the system cycle increases when the system cycle is found increased than the previous system cycle from the measuring, and decreases when the system cycle is found decreased than the previous system cycle as a result of the measuring, a fourth step for creating a change pattern of a latest system cycle on the basis of a deviation of the latest system cycle from a fixed number of cycle-passed previous system cycle, and a fifth step for determining the isolated operation on the basis of the change pattern.

Figure 2:
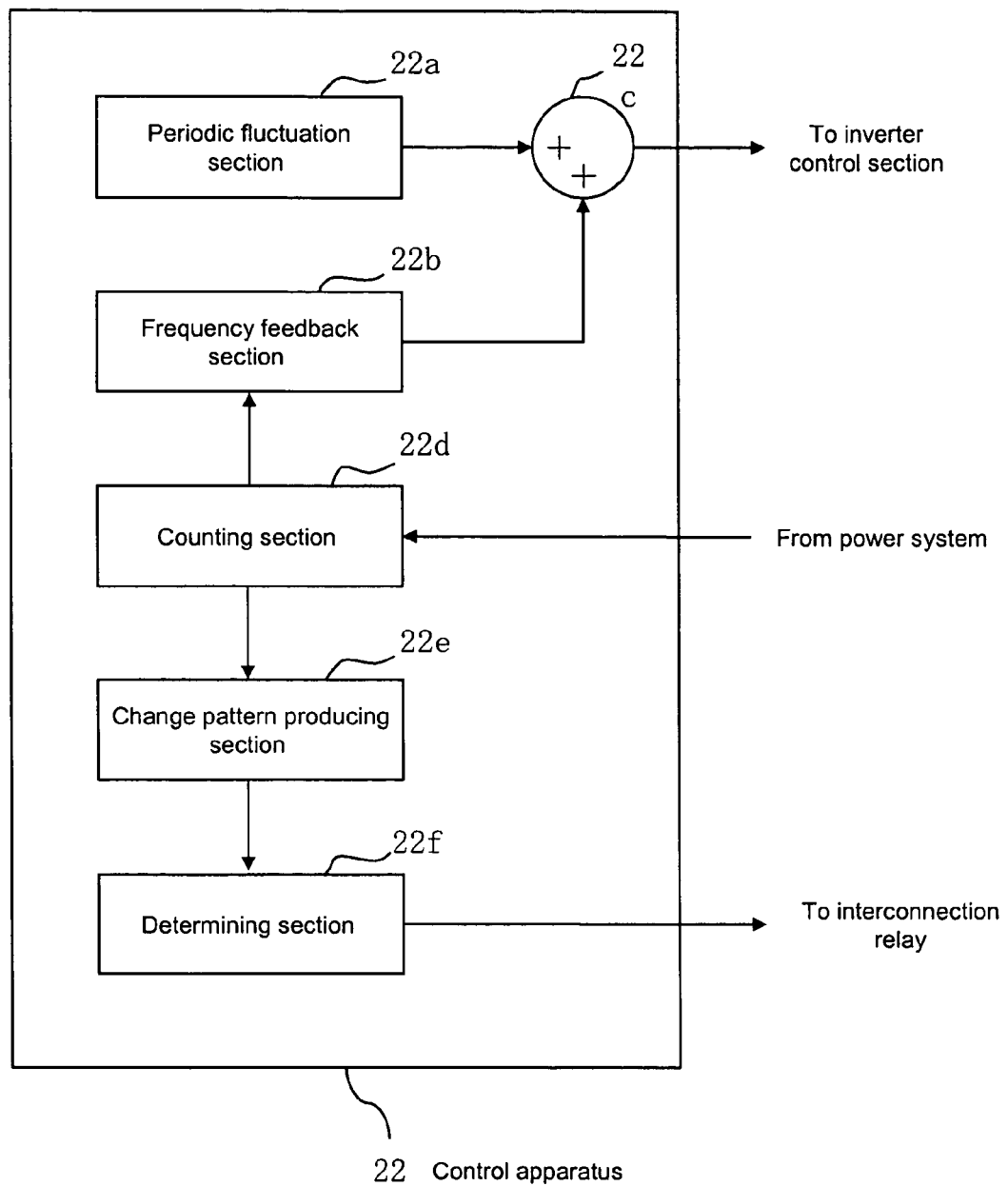
FIG. 2 shows a block diagram of a control apparatus shown in FIG. 1.

Although the control apparatus 22 can be composed of hardware other than a microcomputer, the control apparatus 22 in the present embodiment has incorporated therein a microcomputer, and is illustrated in FIG. 2 by a diagram of the function executed by the software program of the microcomputer. In FIG. 2, numeral 22a denotes a periodic fluctuation section, 22b denotes a frequency feedback section, 22c denotes an adding section, 22d denotes a measuring section, 22e denotes a change pattern producing section, and 22f denotes a determining section.

The first step is executed at the periodic fluctuation section 22a. The periodic fluctuation section 22a preferably fluctuates reactive power at the timing synchronous with the other isolated operation detecting apparatus by a radio-controlled clock or the like. This is for avoiding the mutual cancellation of the reactive power on the power system, which is caused when the reactive power is fluctuated asynchronously by many pieces of isolated operation detecting apparatus. Further, the reactive power is fluctuated in order to periodically break the balance between the detection output of the isolated operation and the power-generation output of the inverter or the current consumption of the load. It is to be noted that, when the reactive power is synchronously injected from many pieces of isolated operation detecting apparatus, the reactive power becomes so excessive enough to raise a flicker problem. In this case, it is preferable that a flicker prevention input is inputted to the adding section 22c to reduce the level of the reactive power.

The second step is executed by the measuring section 22d. The measuring section 22d measures the cycle (system cycle) of the voltage waveform of the power system. The measuring technique of the system cycle is well known, and the explanation thereof is omitted.

The third step is executed by the frequency feedback section 22b and the adding section 22c. The frequency feedback section 22b inputs adjustment reactive power to the adding section 22c. The inputted adjustment reactive power increases the system cycle when the system cycle measured by the measuring section 22d is found increased than the previous system cycle, and decreases the system cycle when the system cycle is found decreased than the previous system cycle. Thus, the reactive power is adjusted.

The fourth step is executed by the change pattern producing section 22e. The change pattern producing section 22e produces a change pattern of the latest system cycle on the basis of the deviation of the latest system cycle from the fixed number of cycle-passed previous system cycle.

The fifth step is executed by the determining section 22f.

The determination condition of the determining section 22f will be explained with reference to FIG. 3.

In FIG. 3, ni is a system cycle of i cycles before the latest cycle. The smaller the i number is, the more latest the system cycle is. Therefore, n0 is the latest system cycle, and n23 is the oldest system cycle. N0, N1, N2, and N3 are data (system cycles) of each of n0, n1, n2, and n3. Nave is average data of the previous system cycles of n14 to n23 from which two system cycles, the smallest and biggest, are excluded. The reason why the system cycles n4 to n13 between the system cycles this time and the previous system cycles are excluded from the average calculation is to secure the stable average data earlier enough before the isolated operation to correctly determine abnormality of the-isolated operation in case the system cycles this time n0, n1, n2, and n3 happen to be the cycles after the isolated operation occurred.

The system cycle varies depending upon the value of the power frequency of the power system, i.e., 50 Hz and 60 Hz. In 50 Hz, one system cycle is 20 ms, while in 60 Hz, one system cycle is 16.7 ms. The case of 50 Hz will be described in the explanation below for the sake of convenience.

The reason why the system cycles n4 to n14 are excluded will be explained in detail with reference to FIG. 4. In FIG. 4A, there is no interval between Nave and N3, and the system cycle (frequency) gently changes upon the isolated operation. In this case, the frequency change is contained in Nave, so that stable average data cannot be secured. Therefore, the difference between N0~N3 and Nave becomes so subtle that it becomes difficult to detect the isolated operation. In FIG. 4B, the system frequency fluctuates with gentle cycle. Therefore, when the interval between Nave and N3 is big and Nave fluctuates so that the difference between N0~N3 and Nave is reduced upon the isolated operation, the detection of the isolated operation becomes difficult. From the above, a suitable interval between Nave and N3 is needed. The allowable longest isolated operation detecting time is considered to be about 200 ms upon an accident caused by the contact of high-voltage section and low-voltage section. Considering such accident, the interval between N3 and Nave is set to about 200 ms as shown in FIG. 4C. The interval between N3 and Nave that is the interval between the latest system cycle and the previous system cycle may be a fixed interval. The fixed interval is 100 to 260 ms (50 Hz: 5 cycles to 13 cycles), and 83 to 217 ms (60 Hz:5 cycles to 13 cycles).

The abnormality determining condition of the isolated operation is established by the equations described below. In the equations, th0 is the zeroth threshold value, th1 is the first threshold value, th2 is the second threshold value, and th3 is the third threshold value, wherein th0>th1>th2>th3; The threshold value is set such that the more latest the system cycle is, the greater the threshold value becomes.

The abnormality determining condition is established by the following equations (1) to (4) when N0−Nave>0, $$N0-Nave > th0 \qquad (1)$$

$$N1-Nave > th1 \qquad (2)$$

$$N2-Nave > th2 \qquad (3)$$

$$N4-Nave > th3 \qquad (4)$$

or by the equations (5) to (8) when N0−Nave<0, $$Nave-N0 > th0 \qquad (5)$$

$$Nave-N1 > th1 \qquad (6)$$

$$Nave-N2 > th2 \qquad (7)$$

$$Nave-N3 > th3 \qquad (8)$$

FIG. 5 shows the change patterns that are determined to be the isolated operation in accordance with the equations for the determining conditions. P1 to P4 is a change pattern, A is a determination area when N0−Nave>0, and B is a determination area when N0−Nave<0. The determination area is determined by the above-mentioned threshold values th0 to th3.

Figure 5A:
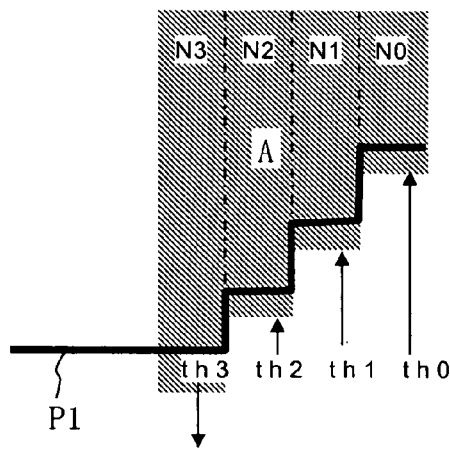
FIGS. 5A, 5B, 5C and 5D show diagrams illustrating a relationship between a determination area of an isolated operation and a change pattern upon the isolated operation.
Figure 5B:
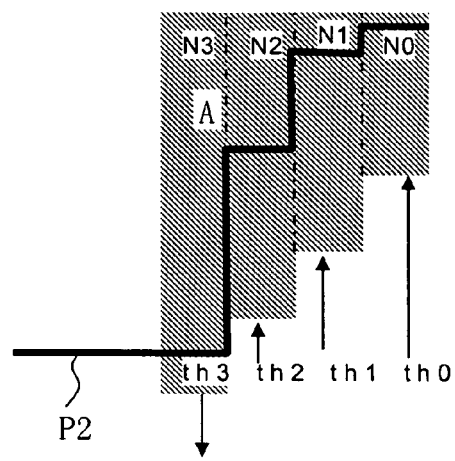
Figure 5C:
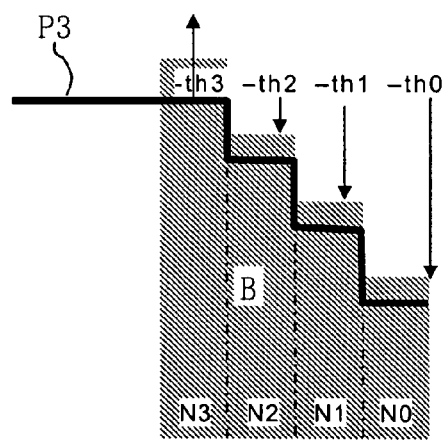
Figure 5D:
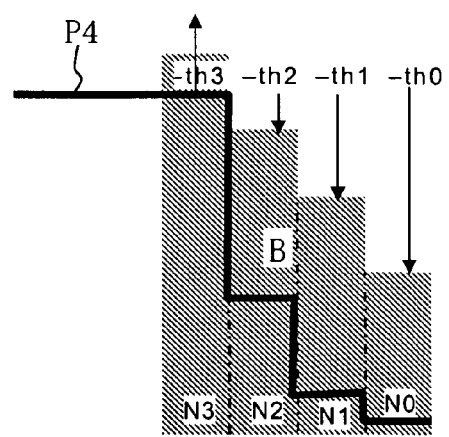

FIGS. 5A and 5B show the change patterns P1 and P2 of the isolated operation in which the system cycle monotonously increases, while FIGS. 5C and 5D show the change patterns P3 and P4 of the isolated operation in which the system cycle monotonously decreases. When N0−Nave>0, the change patterns P1 and P2 are within the determination area A, resulting in that it can be determined to be the isolated operation. When N0−Nave<0, the change patterns P3 and P4 are within the determination area B, resulting in that it can be determined to be the isolated operation.

In FIG. 5, the upward arrow indicates that the threshold value is positive, while the downward arrow indicates that the threshold value is negative.

There may be a case in which the frequency upon the isolated operation changes to be positive after once being negative. In such a case, in order to make the detection in four cycles after the start of the isolated operation, the threshold value of N3 is set to be negative as shown in FIGS. 5A and 5B. When the threshold value decreases, the threshold value of N3 is set to be positive as shown in FIGS. 5C and 5D.

Figure 6A:
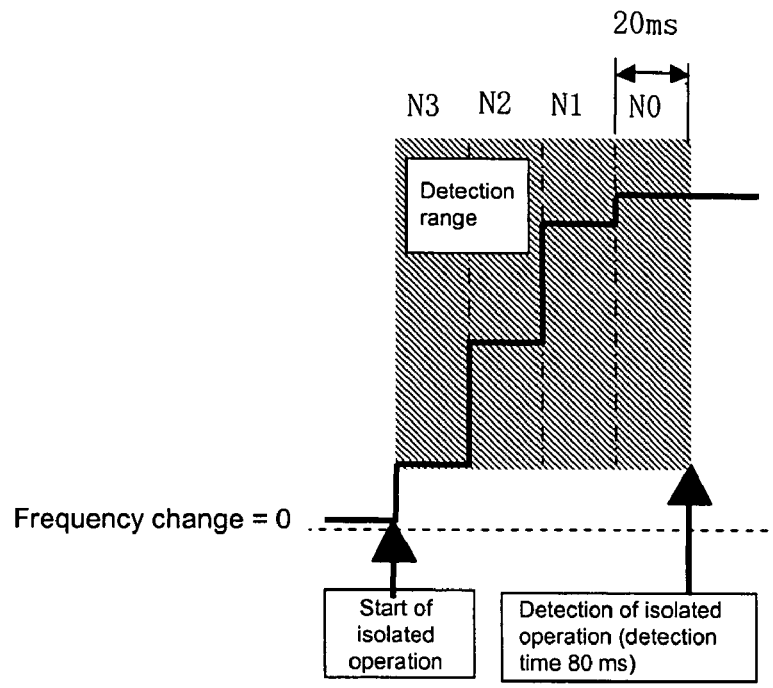
FIGS. 6A and 6B show explanatory views for comparing the embodiment and an example in which a detection threshold value is lowered.
Figure 6B:
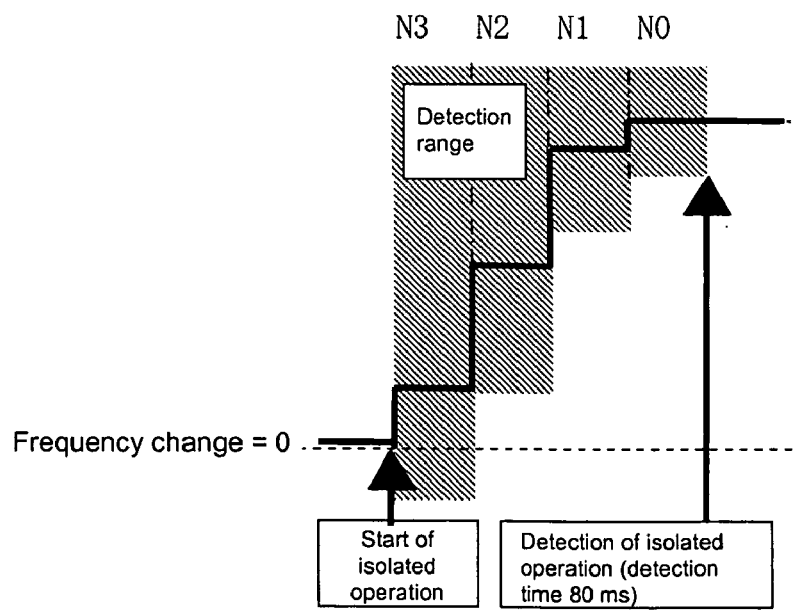
Figure 7A:
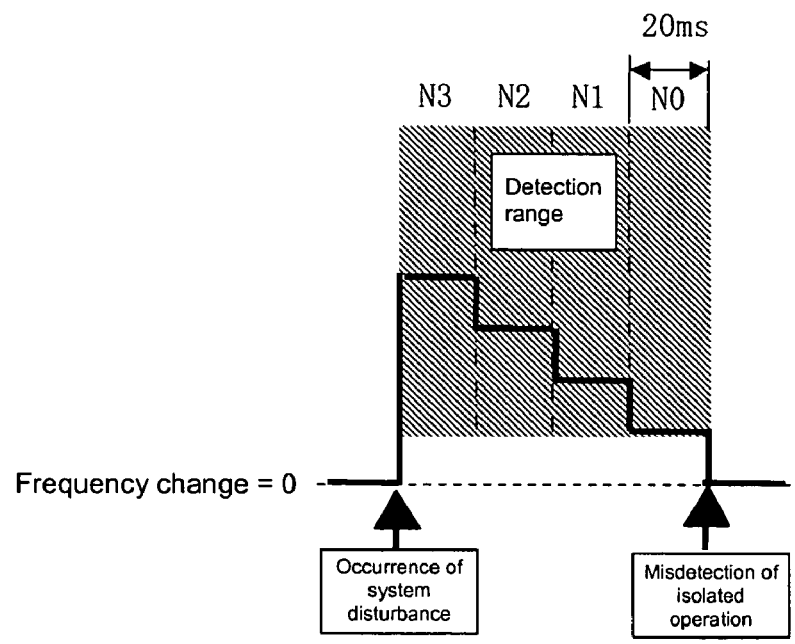
FIGS. 7A and 7B show explanatory views for comparing the embodiment and an example in which a detection threshold value is lowered.
Figure 7B:
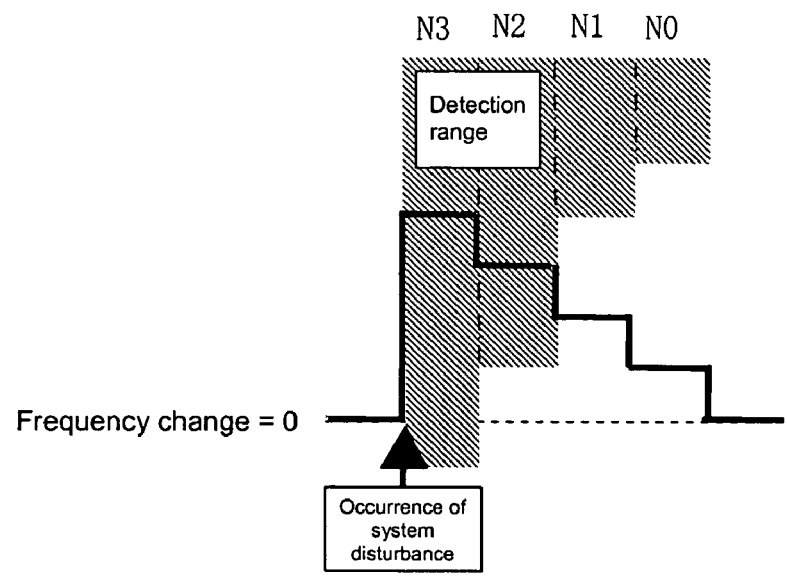

There is a drawback that the unnecessary operation is easily generated only by reducing the detection threshold value. This will be explained with reference to FIGS. 6 and 7. FIG. 6 shows the relationship between the threshold values and system frequencies upon the isolated operation, while FIG. 7 shows the same relationship upon the non-isolated operation (system frequency disturbance). FIGS. 6A and 7A show the case in which the threshold value is decreased, while FIGS. 6B and 7B show the case of the present embodiment. When the detection threshold value is decreased, the high-speed detection of the isolated operation is possible (in FIG. 6A, detection is made at 80 ms). However, when the frequency is fluctuated due to the system disturbance (application of large load, parallel-off), misdetection (unnecessary operation) might occur (FIG. 7A). The frequency only transiently fluctuates due to the system disturbance as shown in FIG. 7. On the other hand, the frequency fluctuation upon the isolated operation increases the power fluctuation so as to make a positive feedback to the change in the system frequency because of the frequency feedback function (third step in FIG. 2), whereby the system frequency changes in a fixed direction (increase or decrease). Focusing on this characteristic, the stepwise threshold values are set as shown in FIGS. 6B and 7B, thereby realizing a high-speed detection (20 ms×4=80 ms) without causing misdetection (unnecessary operation).

As described above, the detection of the isolated operation is possible from the change pattern in FIG. 5 without causing misdetection of the isolated operation in the present embodiment.

Returning back to FIG. 1, in the isolated operation detecting apparatus 20 externally mounted to the distributed power supply 10, a control instruction for periodically injecting the power fluctuation into the power system is inputted to the inverter control section 23 from the control apparatus 22. By this instruction, the inverter control section 23 drives the inverter 24 to inject reactive power fluctuation into a power line 27. It is to be noted that the interconnection relays 21 and 25 are closed by the control apparatus 22. A conventional DC current power conversion inverter, not shown, is also incorporated into the distributed power supply 10, and the inverter 24 in the isolated operation detecting apparatus 20 is used exclusively for injecting the reactive power fluctuation. The explanation is made on the assumption that an unillustrated DC current power conversion inverter is similarly incorporated in the distributed power supply in FIG. 9 described later showing a configuration in which the control apparatus according to the present embodiment is mounted to an isolated operation detecting apparatus externally mounted to a distributed power supply, like the case in FIG. 1. The control apparatus 22 measures the system cycle from the voltage waveform from the power line 27. The control apparatus 22 controls for adjusting the injection of the power fluctuation so that the system cycle increases when the system cycle measured this time is found increased than the previous system cycle, and system cycle decreases when the system cycle is found decreased than the previous system cycle. Therefore, the control apparatus 22 inputs the adjustment control instruction to the inverter control section 23. The inverter control section 23 drives the inverter 24 in response to the adjustment control instruction, whereby the adjusted reactive power fluctuation is injected into the power line 27. On the other hand, the control apparatus 22 produces the change pattern of the latest system cycle on the basis of the deviation of the latest system cycle from the fixed number of cycle-passed previous system cycle, and determines the isolated operation on the basis of the change pattern, as explained with reference to FIGS. 3 and 5. When the control apparatus 22 determines the isolated operation, it turns off the interconnection relays 21 and 25, and inputs a control instruction for stopping the inverter to the inverter control section 23 to thereby stop the inverter 24. On the other hand, when the control apparatus 22 determines the unnecessary operation, not the isolated operation, it continues the operation. Thus, the present embodiment makes it possible to detect an isolated operation with high speed and to stop the isolated operation without causing a misdetection of the isolated operation by detecting unnecessary operation.

Figure 8:
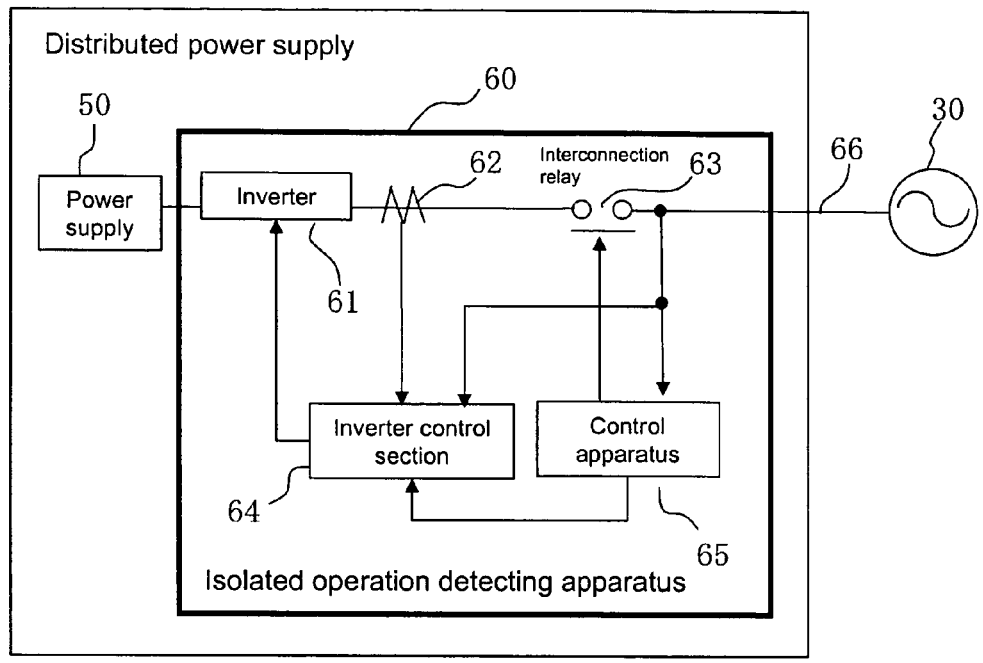
FIG. 8 shows a diagram of a configuration of another power control system composed of a distributed power supply and an isolated operation detecting apparatus, to which an isolated operation detecting method according to the embodiment of the present invention is applied.

FIG. 8 shows a distributed power supply having incorporated therein an isolated operation detecting apparatus. This distributed power supply is composed of a power main unit 50 such as a solar cell, fuel cell, or the like, and an isolated operation detecting apparatus 60. The isolated operation detecting apparatus 60 has an inverter 61, a current detector 62, an interconnection relay 63, an inverter control section 64, and a control apparatus 65 according to the embodiment. The inverter 61 in this case has both the inverter operations of a conventional inverter for converting DC current power and an inverter for injecting reactive power fluctuation, for the sake of convenience.

In the above-mentioned configuration, in the isolated operation detecting apparatus 60, a control instruction for periodically injecting power fluctuation into the power system is inputted to the inverter control section 64 from the control apparatus 65. Accordingly, the inverter control section 64 drives the inverter 61 to inject the reactive power fluctuation into a power line 66. The interconnection relay 63 is closed by the control apparatus 65.

The control apparatus 65 measures the system cycle from the voltage waveform from the power line 66. The control apparatus 65 controls for adjusting the injection of the power fluctuation so that the system cycle increases when the system cycle measured this time is found increased than the previous system cycle, and decreases when the system cycle is found decreased than the previous system cycle. Therefore, the control apparatus 65 inputs the adjustment control instruction to the inverter control section 64. The inverter control section 64 drives the inverter 61 in response to the adjustment control instruction, whereby the adjusted reactive power fluctuation is injected into the power line 66.

On the other hand, the control apparatus 65 produces the change pattern of the latest system cycle on the basis of the deviation of the latest system cycle from the fixed number of cycle-passed previous system cycle, and determines the isolated operation on the basis of the change pattern, as explained with reference to FIGS. 3 and 5. When the control apparatus 65 determines the isolated operation, it turns off the interconnection relay 63, and inputs a control instruction for stopping the inverter to the inverter control section 64 to thereby stop the inverter 61. On the other hand, when the control apparatus 65 determines the unnecessary operation, not the isolated operation it continues the operation. Thus, the present embodiment makes it possible to detect an isolated operation with high speed and to stop the isolated operation without causing a misdetection of the isolated operation by detecting unnecessary operation.

Figure 9:
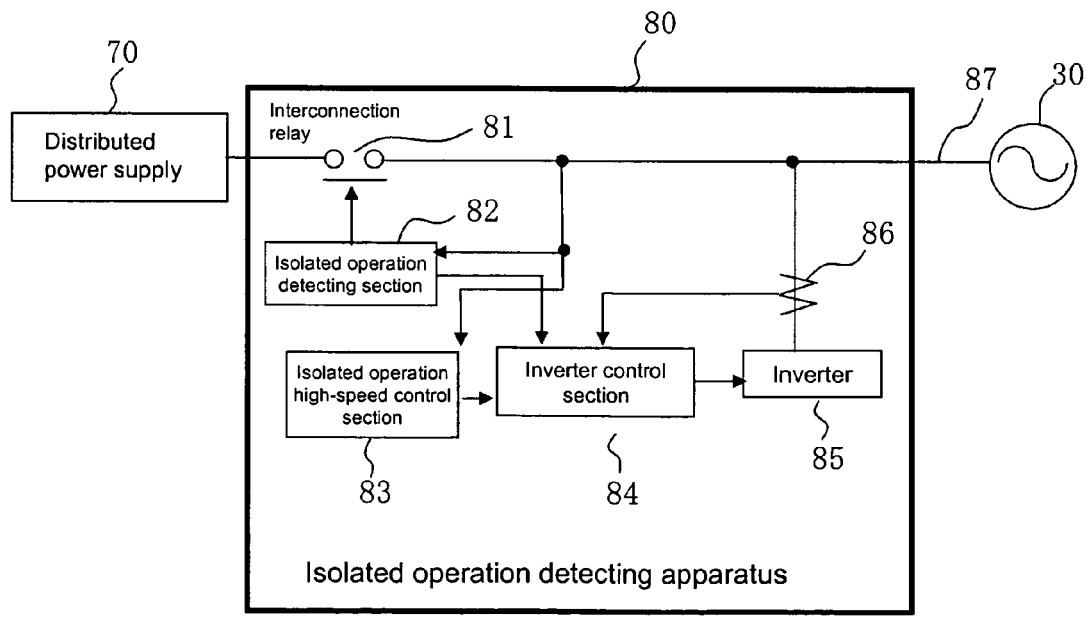
FIG. 9 shows a diagram of a configuration of still another power control system composed of a distributed power supply and an isolated operation detecting apparatus, to which an isolated operation detecting method according to the embodiment of the present invention is applied.

FIG. 9 shows a distributed power supply having externally mounted thereto an isolated operation detecting apparatus provided with a control apparatus according to the present embodiment, like FIG. 1. An isolated operation detecting apparatus 80 is externally mounted to a distributed power supply 70. The isolated operation detecting apparatus 80 has an interconnection relay 81, an isolated operation detection determining section 82, isolated operation high-speed control section 83, an inverter control section 84, an inverter 85, and a current detector 86.

In the isolated operation detecting apparatus 80, the isolated operation detection determining section 82 and the isolated operation high-speed control section 83 correspond to the control apparatus 22 (control apparatus according to the embodiment of the present invention) in FIG. 1. The isolated operation detection determining section 82 and the isolated operation high-speed control section 83 make a control operation of the control apparatus according to the embodiment of the present invention in interconnection with each other.

A control instruction for periodically injecting power fluctuation into the power system is inputted to the inverter control section 84 from the isolated operation high-speed control section 83. Accordingly, the inverter control section 84 drives the inverter 85 to inject the reactive power fluctuation into a power line 87.

The isolated operation high-speed control section 83 measures the system cycle from the voltage waveform from the power line 87. The isolated operation high-speed control section 83 controls for adjusting the injection of the power fluctuation so that the system cycle increases when the system cycle measured this time is found increased than the previous system cycle, and decreases when the system cycle is found decreased than the previous system cycle. Therefore, the isolated operation high-speed control section 83 inputs the adjustment control instruction to the inverter control section 84. The inverter control section 84 drives the inverter 85 in response to the adjustment control instruction, whereby the adjusted reactive power fluctuation is injected into the power line 87.

On the other hand, the isolated operation detection determining section 82 produces the change pattern of the latest system cycle on the basis of the deviation of the latest system cycle from the fixed number of cycle-passed previous system cycle, and determines the isolated operation on the basis of the change pattern, as explained with reference to FIGS. 3 and 5. When the isolated operation detection determining section 82 determines the isolated operation, it turns off the interconnection relay 81, and inputs a control instruction for stopping the inverter to the inverter control section 84 to thereby stop the inverter 85. On the other hand, when the isolated operation detection determining section 82 determines the unnecessary operation, not the isolated operation, it continues the operation. Thus, the present embodiment makes it possible to detect an isolated operation with high speed and to stop the isolated operation without causing a misdetection of the isolated operation by detecting unnecessary operation.

Figure 10:
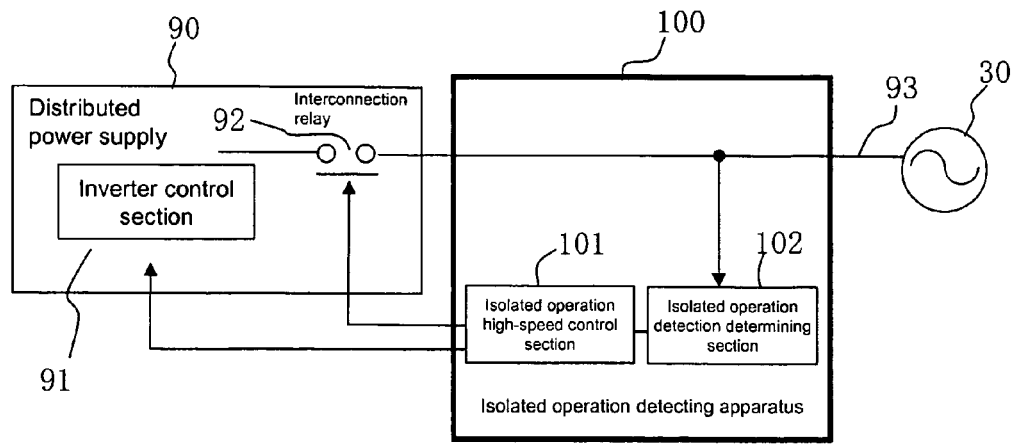
FIG. 10 shows a diagram of a configuration of still another power control system composed of a distributed power supply and an isolated operation detecting apparatus, to which an isolated operation detecting method according to the embodiment of the present invention is applied.

FIG. 10 shows a distributed power supply to which an isolated operation detecting apparatus is externally mounted, like the case of FIG. 9. An isolated operation detecting apparatus 100 is externally mounted to a distributed power supply 90. However, different from the case in FIG. 9, this embodiment shows the case in which the distributed power supply 90 has an inverter control section 91, an unillustrated inverter controlled by the inverter control section 91, and an interconnection relay 92. The inverter not shown in this case has both the inverter operations of a conventional inverter for converting DC current power and an inverter for injecting reactive power fluctuation, like the inverter shown in FIG. 8. On the other hand, the isolated operation detecting apparatus 100 has an isolated operation detection determining section 102 and an isolated operation high-speed control section 101 that constitute the control apparatus according to the embodiment of the present invention.

In the isolated operation detecting apparatus 100 thus configured, the isolated operation high-speed control section 101 inputs a control instruction for periodically injecting power fluctuation into the power system to the inverter control section 91. Accordingly, the inverter control section 91 drives the inverter to inject reactive power fluctuation into a power line 93.

The isolated operation high-speed control section 101 measures the system cycle from the voltage waveform from the power line 93. The isolated operation high-speed control section 101 controls for adjusting the injection of the power fluctuation so that the system cycle increases when the system cycle measured this time is found increased than the previous system cycle, and decreases when the system cycle is found decreased than the previous system cycle. Therefore, the isolated operation high-speed control section 101 inputs the adjustment control instruction to the inverter control section 91. The inverter control section 91 drives the unillustrated inverter in response to the adjustment control instruction, whereby the adjusted reactive power fluctuation is injected into the power line 93. When the isolated operation detection determining section 102 determines the isolated operation, the isolated operation high-speed control section 101 turns off the interconnection relay 92, and inputs a control instruction for stopping the inverter to the inverter control section 91 to thereby stop the inverter, in response to the determination. On the other hand, when the isolated operation detection determining section 102 determines the unnecessary operation, not the isolated operation, it continues the operation. Thus, the present embodiment makes it possible to detect an isolated operation with high speed and to stop the isolated operation without causing a misdetection of the isolated operation by detecting unnecessary operation.

Figure 11:
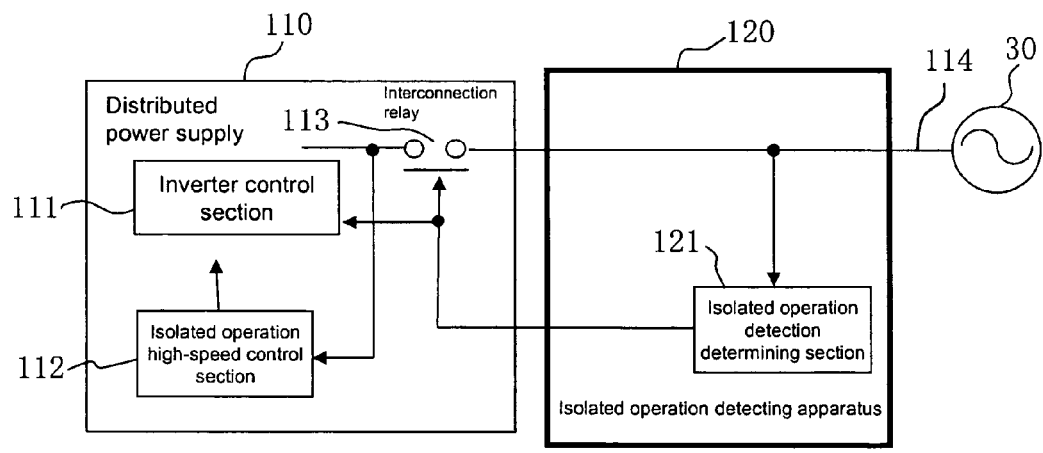
FIG. 11 shows a diagram of a configuration of still another power control system composed of a distributed power supply and an isolated operation detecting apparatus, to which an isolated operation detecting method according to the embodiment of the present invention is applied.

FIG. 11 shows a distributed power supply to which an isolated operation detecting apparatus is externally mounted, like the case of FIG. 10. An isolated operation detecting apparatus 120 is externally mounted to a distributed power supply 110. However, this embodiment shows the case in which the distributed power supply 110 has an isolated operation high-speed control section 112 that corresponds to a part of the control apparatus according to the embodiment of the present invention, in addition to an inverter control section 111, an unillustrated inverter controlled by the inverter control section 111, and an interconnection relay 113. On the other hand, the isolated operation detecting apparatus 120 has an isolated operation detection determining section 121 that corresponds to the other part of the control apparatus. The inverter not shown in this case has both the inverter operations of a conventional inverter for converting DC current power and an inverter for injecting reactive power fluctuation, like the inverters shown in FIG. 8 and FIG. 10.

In the above-mentioned configuration, the isolated operation high-speed control section 112 inputs a control instruction for periodically injecting power fluctuation into the power system to the inverter control section 111. Accordingly, the inverter control section 111 drives the inverter to inject reactive power fluctuation into a power line 114.

The isolated operation high-speed control section 112 measures the system cycle from the voltage waveform from the power line 114. The isolated operation high-speed control section 112 controls for adjusting the injection of the power fluctuation so that the system cycle increases when the system cycle measured this time is found increased than the previous system cycle, and in decreases when the system cycle is found decreased than the previous system cycle. Therefore, the isolated operation high-speed control section 112 inputs the adjustment control instruction to the inverter control section 111. The inverter control section 111 drives the unillustrated inverter in response to the adjustment control instruction, whereby the adjusted reactive power fluctuation is injected into the power line 114. When the isolated operation detection determining section 121 determines the isolated operation, it turns off the interconnection relay 113, and inputs a control instruction for stopping the inverter to the inverter control section 111 to thereby stop the inverter. On the other hand, when the isolated operation detection determining section 121 determines the unnecessary operation, not the isolated operation, it continues the operation. Thus, the present embodiment makes it possible to detect an isolated operation with high speed and to stop the isolated operation without causing a misdetection of the isolated operation by detecting unnecessary operation.

Explained below are the examples to which a countermeasure for the unnecessary operation, which is the subject to be solved involved with the embodiment of the present invention, is assumed to be taken.

EXAMPLE 1

This example shows the case in which an isolated operation can be detected even if a frequency of system cycles is changed as being fluctuated due to the influence of a load or power conditioner upon the isolated operation.

Figures 12A, 12B:
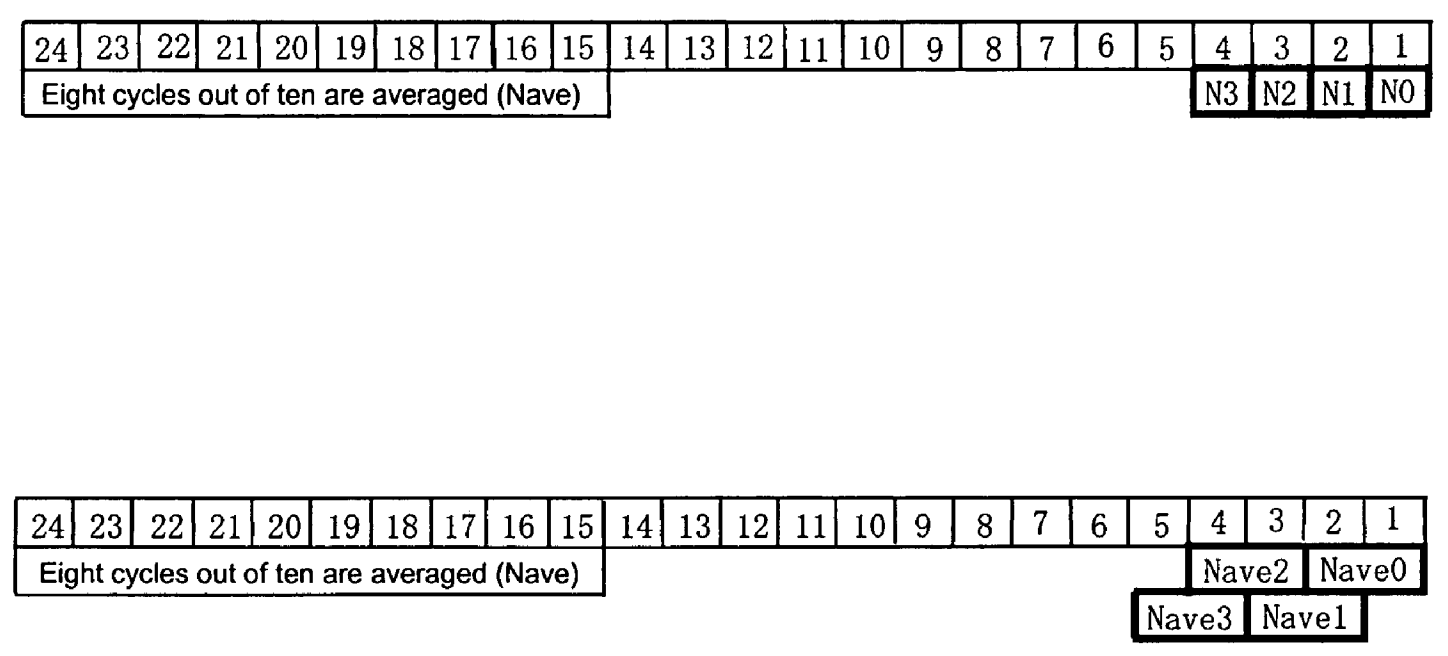
Figure 13A:
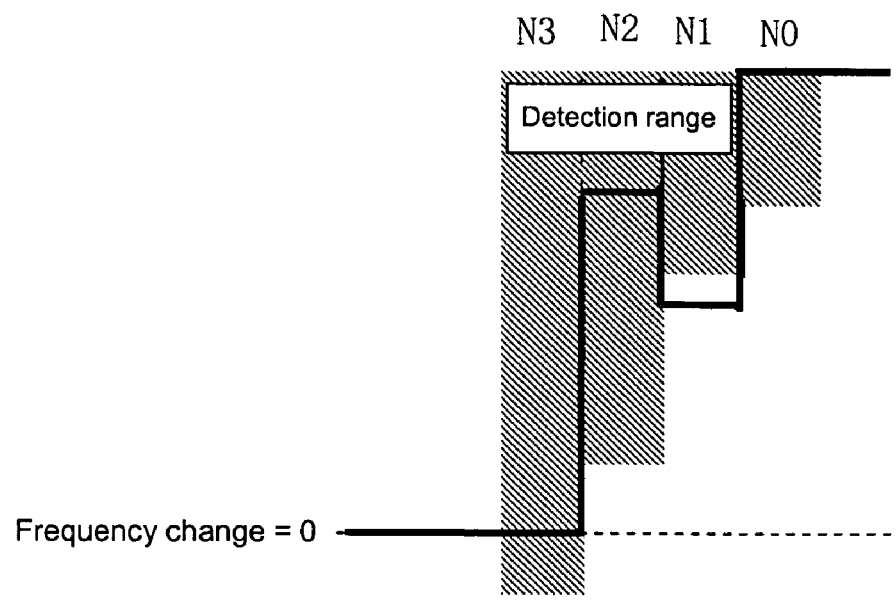
FIGS. 13A and 13B show diagrams illustrating a relationship between a determination area of an isolated operation and a change pattern upon the isolated operation of the example 1.

Specifically, the frequency at the stepwise threshold values shown in FIGS. 12A and 13A is outside the detectable range due to the fluctuation of the frequency at the system cycle N1, making the detection of the isolated operation impossible.

Figure 13B:
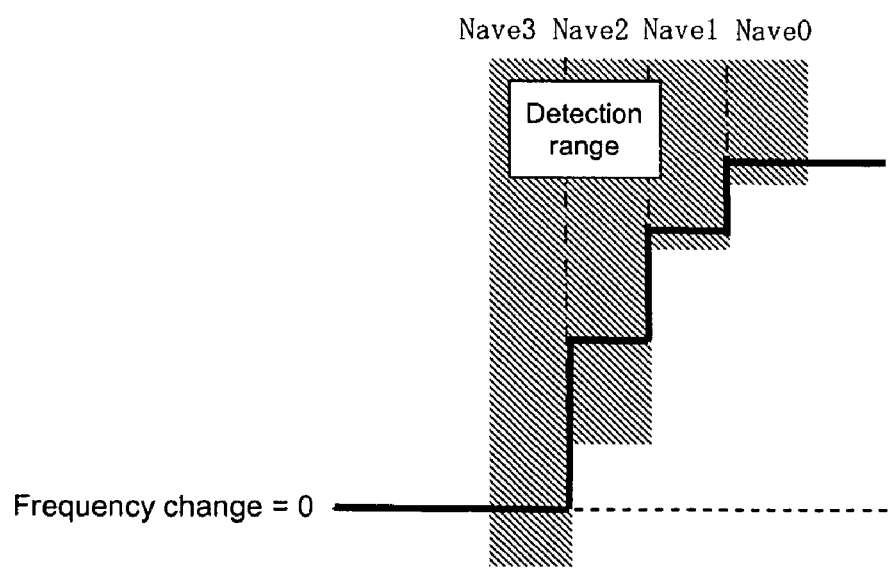

In view of this, two cycles are averaged as shown in FIGS. 12B and 13B in order to eliminate the influence of the frequency fluctuation. Specifically, the average frequency of N0 and N1 is defined as Nave0, instead of N0, the average frequency of N1 and N2 is defined as Nave1, instead of N1, the average frequency of N2 and N3 is defined as Nave2, instead of N2, and the average frequency of N3 and N4 is defined as Nave3, instead of N3. By averaging in this way, the frequency is able to stay inside the detectable range at the system cycle Nave1, whereby the isolated operation can surely be detected.

Although only the case in which the frequency difference increases is illustrated, the same is true when the frequency difference decreases.

Although this embodiment describes the case in which an average value of two cycles is used as the latest system cycle, an average value of three cycles for example may be used.

EXAMPLE 2

This example describes the case in which an isolated operation can be detected even if a frequency change in system cycles is gentle due to the influence of a load (inertia moment of rotating equipment, reactive power such as induced load or capacitive load) or power conditioner upon the isolated operation.

Figure 14A:
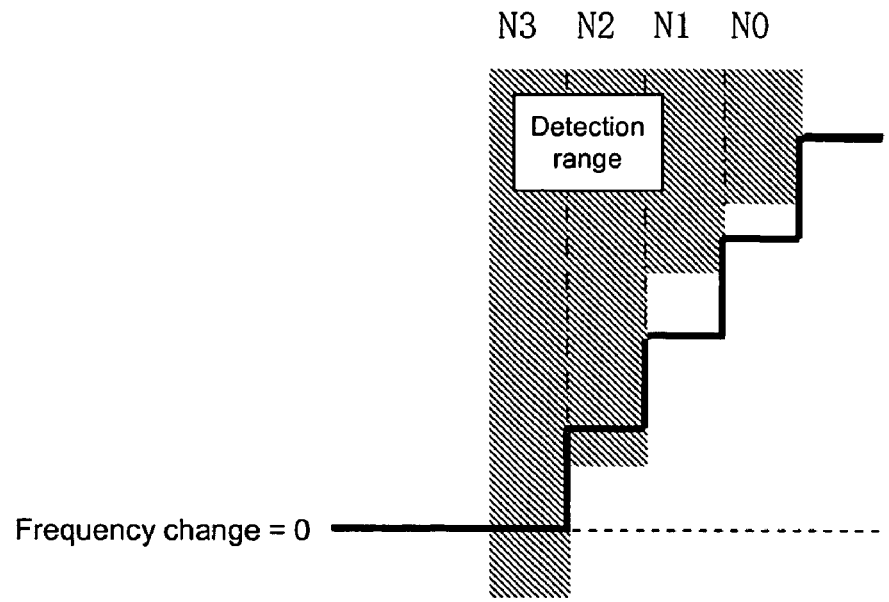
FIGS. 14A and 14B show diagrams illustrating a relationship between a determination area of an isolated operation and a change pattern upon the isolated operation of the example 2.
Figure 14B:
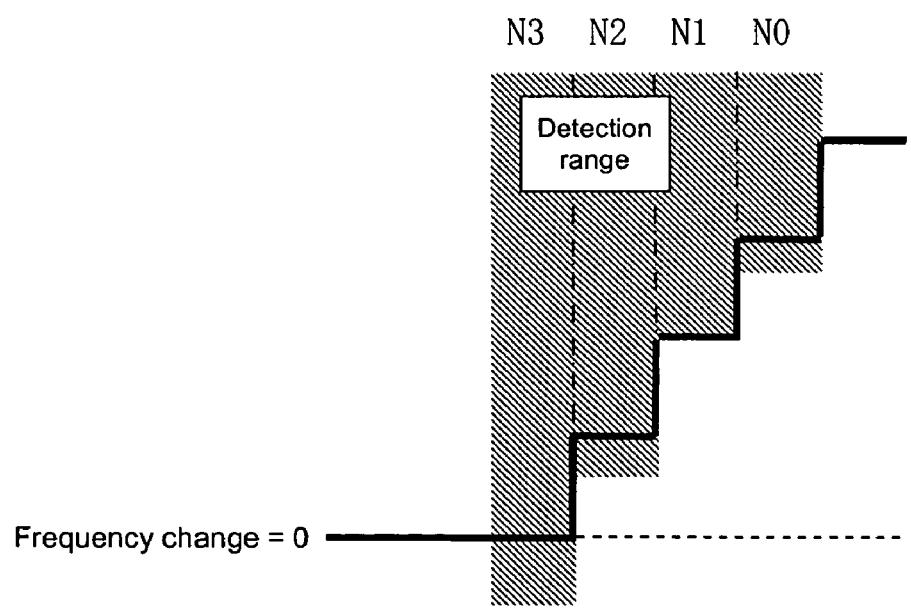

Specifically, the frequency is outside the detectable range due to the gentle change of the frequency at the system cycle N1 in FIG. 14A, making the detection of the isolated operation impossible.

In view of this, the threshold values that are within the detectable range are set to slowly change (the change of the threshold values reduces). Accordingly, the frequency is within the detectable range at the system cycles N0 and N1, whereby the isolated operation can surely be detected.

Although only the case in which the frequency difference increases is illustrated, the same is true when the frequency difference decreases.

EXAMPLE 3

This example also shows the case in which an isolated operation can be detected even if the frequency change in system cycles is gentle upon the isolated operation.

Figure 16A:
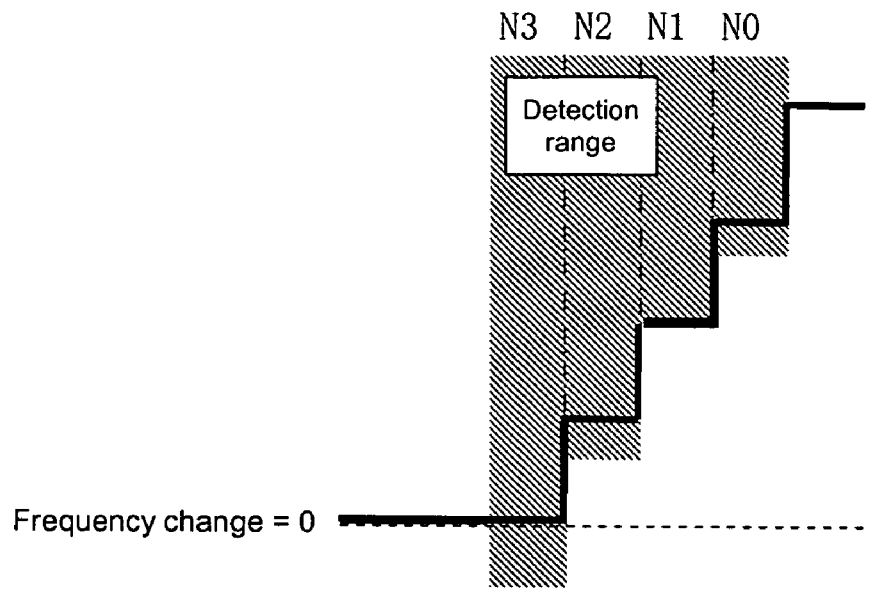
FIGS. 16A and 16B show diagrams illustrating a relationship between a determination area of an isolated operation and a change pattern upon the isolated operation of the example 3.

FIGS. 15A and 16A correspond to the example 2 in which the change of the threshold values is gentle for comparison though.

Figure 16B:
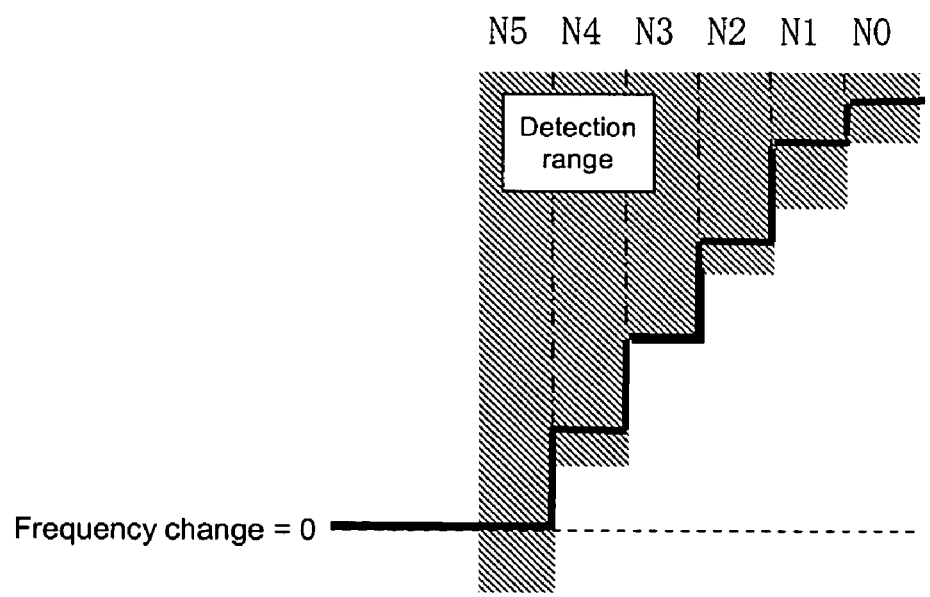

In the present example, the threshold values within the detectable range are set to slowly change, and the detection cycle is prolonged as shown in FIGS. 15B and 16B. Specifically, the detection cycle is N0 to N3 in the example 2, while the detection cycle in the present example is prolonged such as N0 to N5 in order to increase the number of determinations.

Accordingly, the isolated operation can surely be detected even if the frequency change is gentle. Further, when the threshold values are set to slowly change as in the example 2, lowering the detection threshold value, the unnecessary operation might be produced as explained in the example of FIG. 7A. However, by prolonging the detection cycle as in the present example, the decrease in the detection threshold value can be prevented, and hence, the unnecessary operation can be prevented.

Although only the case in which the frequency difference increases is illustrated, the same is true when the frequency difference decreases.

EXAMPLE 4

This example shows the case in which an isolated operation can be detected when a frequency of system cycles is changed as being fluctuated and when the frequency change is gentle.

Figure 18A:
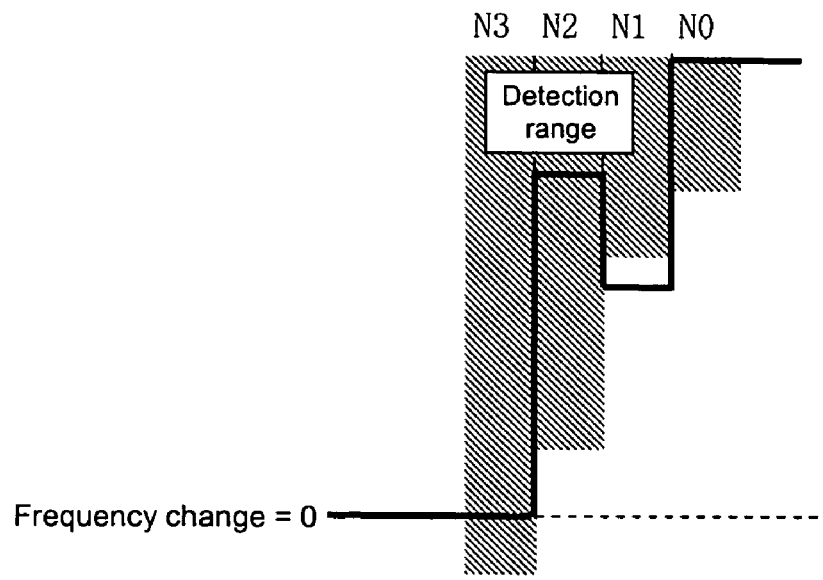
FIGS. 18A and 18B show diagrams illustrating a relationship between a determination area of an isolated operation and a change pattern upon the isolated operation of the example 4.

Specifically, the stepwise threshold values shown in FIGS. 17A and 18A are outside the detectable range due to the fluctuation of the frequency at the system cycle N1, making the detection of the isolated operation impossible.

Figure 18B:
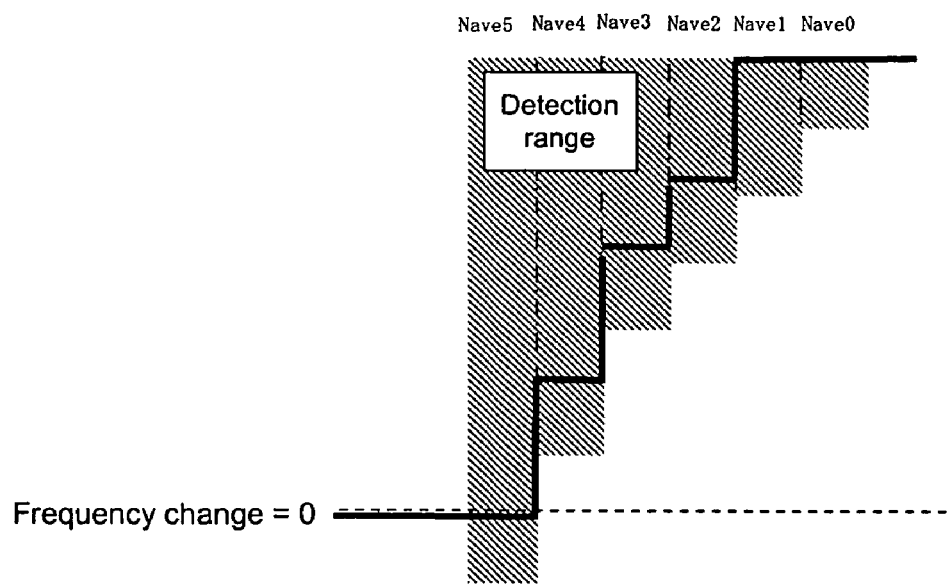

In view of this, two cycles are averaged as shown in FIGS. 17B and 18B in order to eliminate the influence of the frequency fluctuation, and the detection cycle is also prolonged. Specifically, the average frequency of N0 and N1 is defined as Nave0, instead of N0, the average frequency of N1 and N2 is defined as Nave1, instead of N1, the average frequency of N2 and N3 is defined as Nave2, instead of N2, the average frequency of N3 and N4 is defined as Nave3, instead of N3, the average frequency of N4 and N5 is defined as Nave4, and the average frequency of N5 and N6 is defined as Nave5. By averaging in this way, the frequency is able to stay inside the detectable range at the system cycle Nave1, whereby the isolated operation can surely be detected.

Figure 19A:
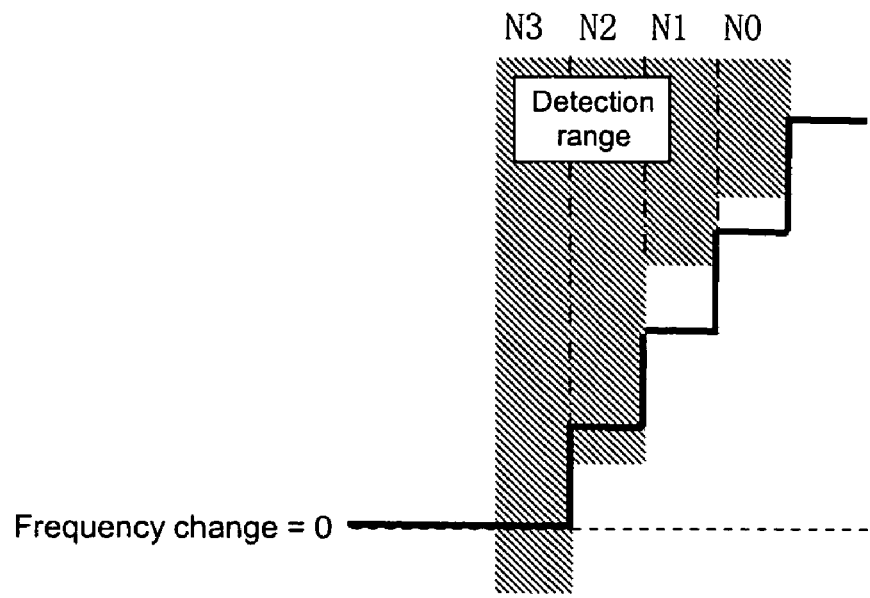
FIGS. 19A and 19B show diagrams illustrating a relationship between a determination area of an isolated operation and a change pattern upon the isolated operation of the example 4.

Further, the frequency is outside the detectable range due to the gentle change of the frequency at the system cycles N0 and N1 in FIGS. 17A and 19A, making the detection of the isolated operation impossible.

Figure 19B:
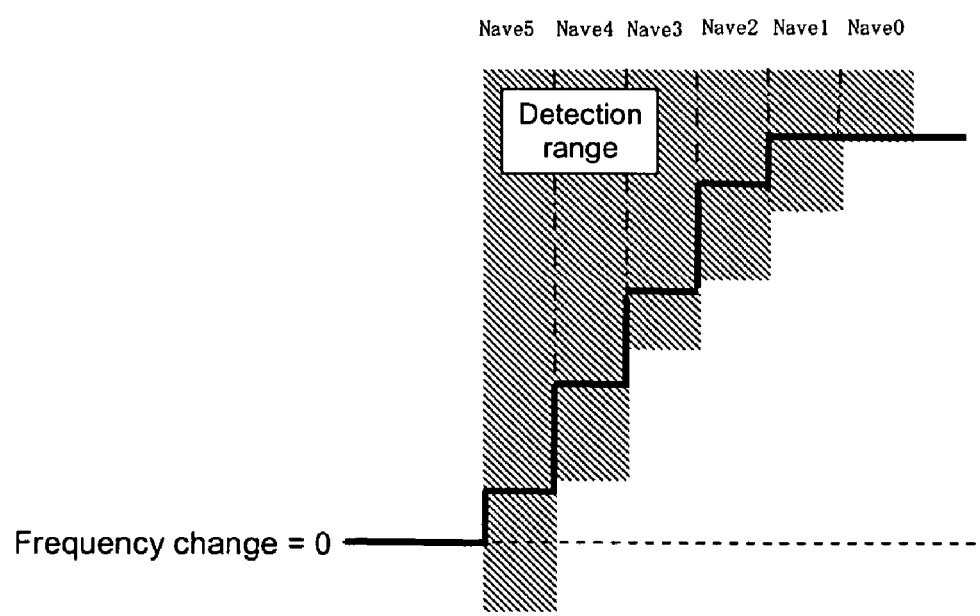

In this case too, two cycles are averaged and the detection cycle is prolonged as shown in FIGS. 17B and 19B, like FIGS. 17B and 18B, whereby the isolated operation can surely be detected even if the frequency change is gentle, and the unnecessary operation can be prevented.

Although only the case in which the frequency difference increases is illustrated, the same is true when the frequency difference decreases.

EXAMPLE 5

This example shows the case of a high-speed detection upon an isolated operation and the case in which an isolated operation can be detected when a frequency is changed as being fluctuated and when the frequency change is gentle.

Figures 20A, 20B:
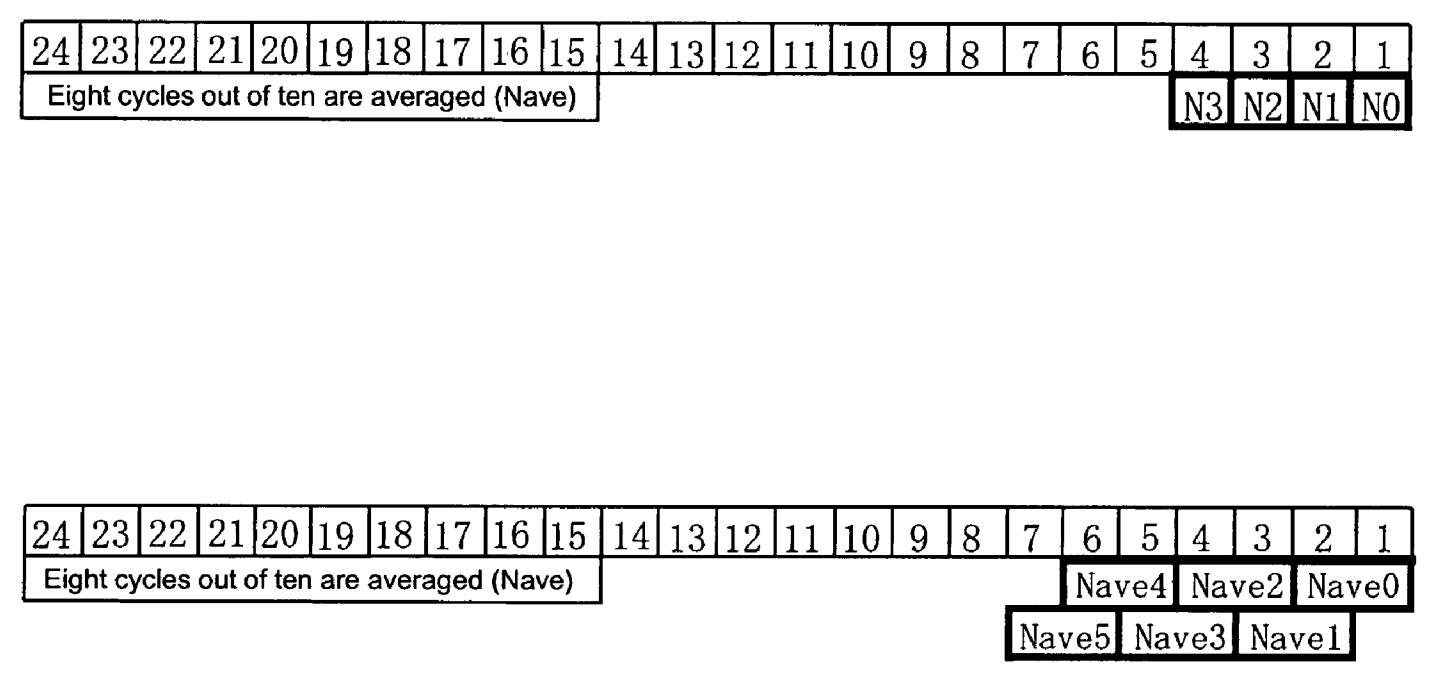
Figure 21:
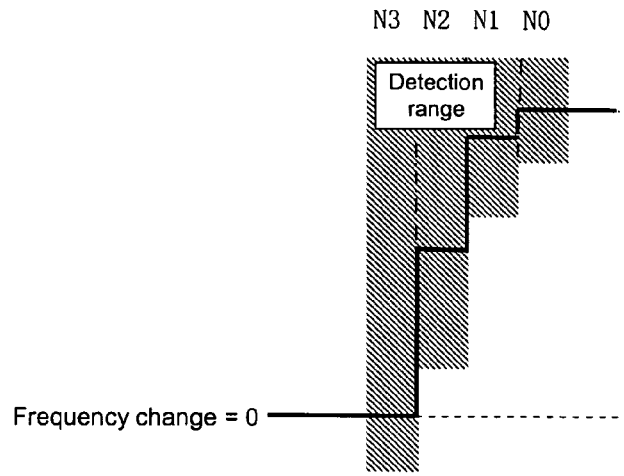
FIG. 21 shows a diagram illustrating a relationship between a determination area of an isolated operation and a change pattern upon the isolated operation of the example 5.

Specifically, in the case of the normal frequency change, a high-speed detection is executed corresponding to the embodiment shown in FIGS. 20A and 21.

Figure 22A:
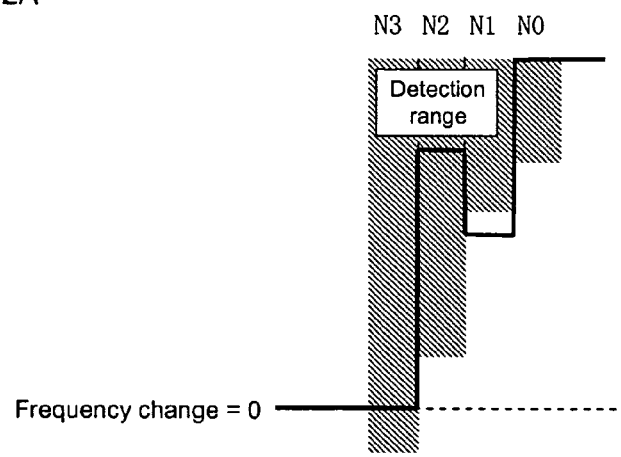
FIGS. 22A and 22B show diagrams illustrating a relationship between a determination area of an isolated operation and a change pattern upon the isolated operation of the example 5.
Figure 22B:
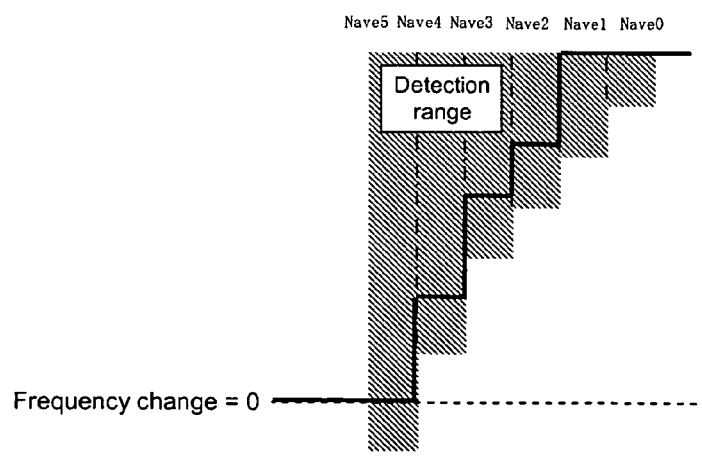

When a frequency is changed as being fluctuated, the isolated operation cannot be detected with the stepwise threshold values shown in FIGS. 20A and 22A. Therefore, the isolated operation is detected by the same method as that in the example 4 as shown in FIGS. 20B and 22B.

Figure 23A:
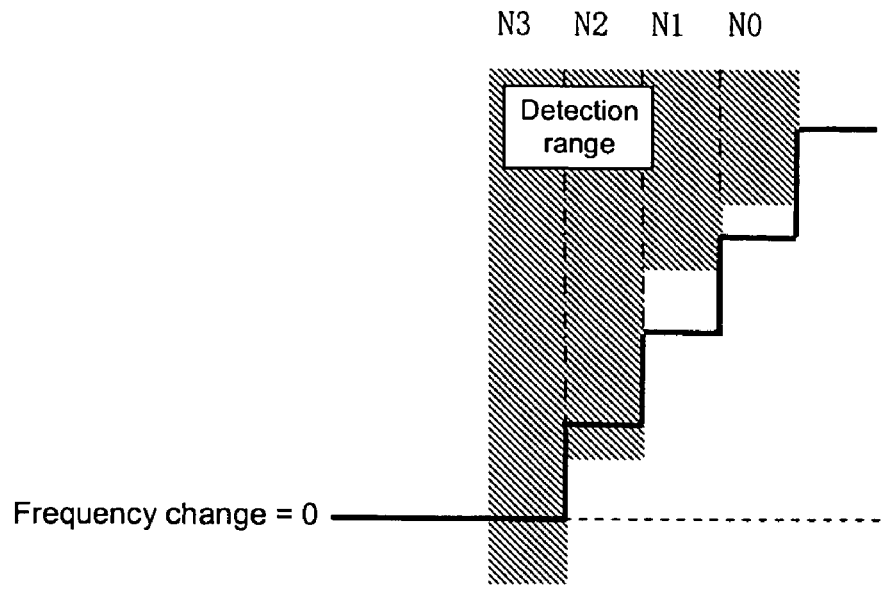
FIGS. 23A and 23B show diagrams illustrating a relationship between a determination area of an isolated operation and a change pattern upon the isolated operation of the example 5.
Figure 23B:
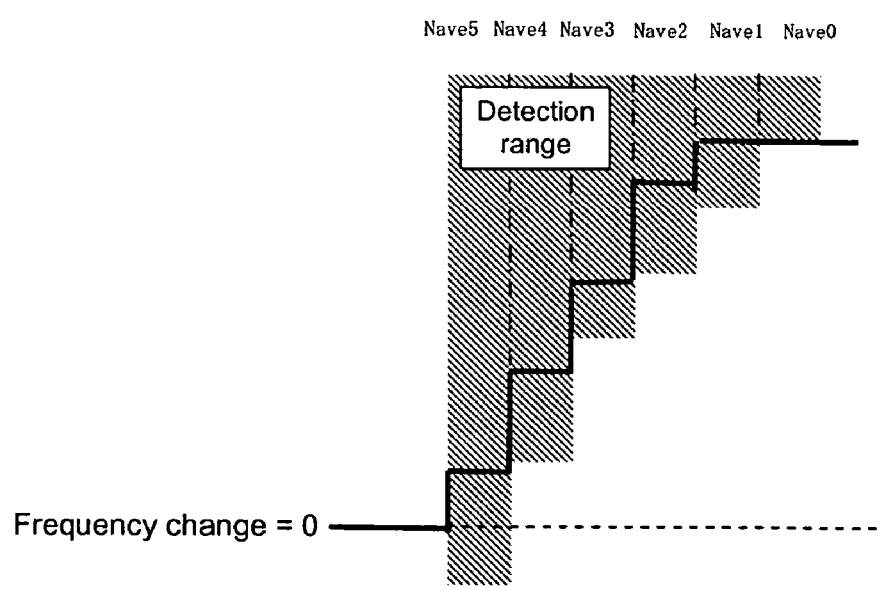
Figure 25:
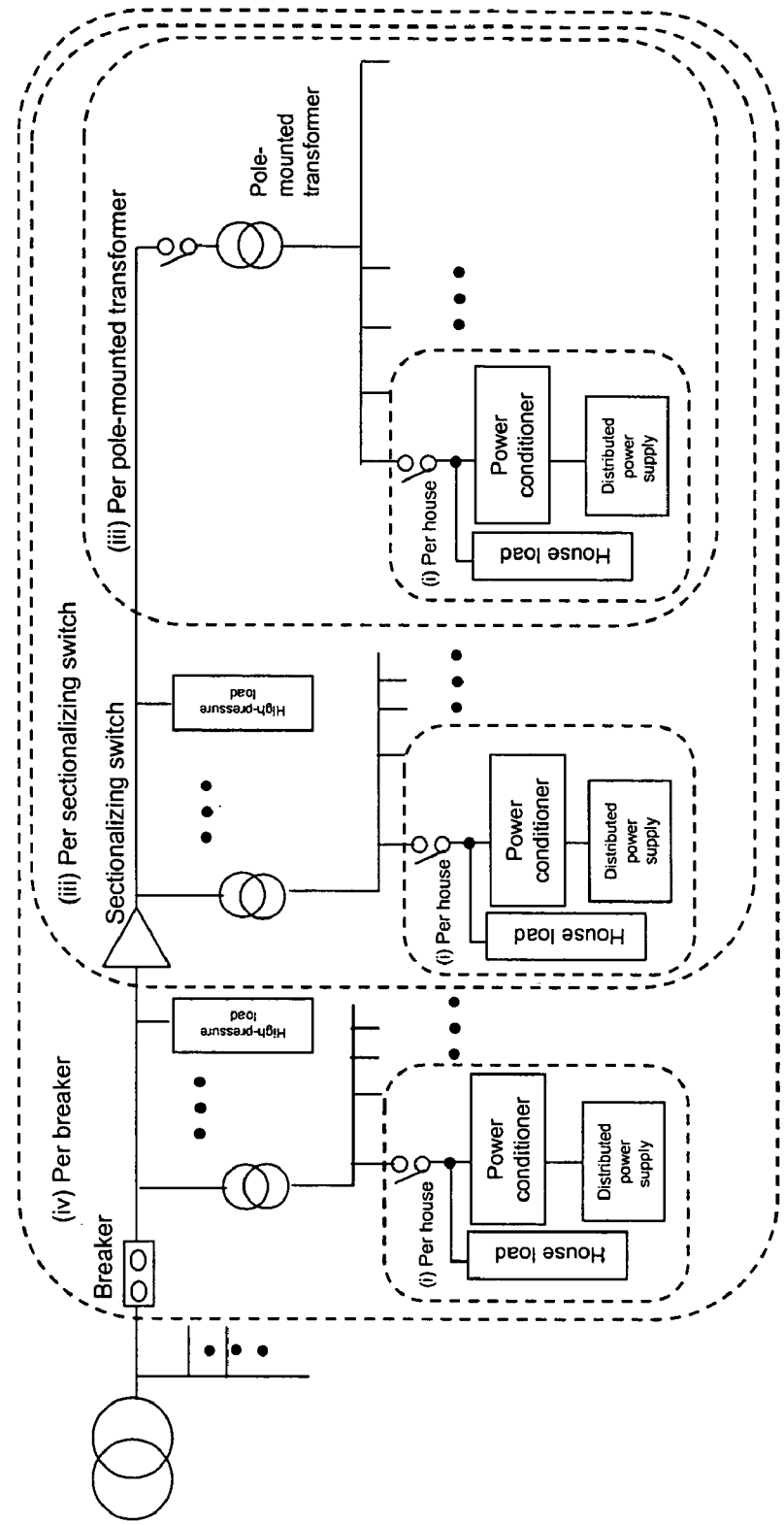
FIG. 25 shows an imaginary diagram in which multiple distributed power supplies are interconnected.

Further, even if the frequency change is gentle, the isolated operation cannot be detected with the stepwise threshold values shown in FIGS. 20A and 23A. Therefore, the isolated operation is detected by the same method as that in the example 4 as shown in FIGS. 20B and 23B.

As described above, the detection threshold values in the embodiment and the detection threshold values in the example 4 are both used, and both of them are switched for use in accordance with the frequency state, whereby a high-speed detection (60 to 80 ms) can normally be realized, and even if the frequency change is gentle with fluctuation, the isolated operation can surely be detected (100 to 120 ms).

Although only the case in which the frequency difference increases is illustrated, the same is true when the frequency difference decreases.

The example in which the detection threshold values in the embodiment and the detection threshold values in the example 4 are both used is illustrated as the present example. However, the present invention is not limited thereto. For example, the detection threshold values in the embodiment and the detection threshold values in any one of the examples 1 to 3 may be used.

FIG. 24 is a table summarizing the isolated operation detecting method according to the embodiment and the examples 1 to 5 and their effects. The effect (1) means that an isolated operation can be detected even if a frequency of system cycles is changed as being fluctuated, the effect (2) means that an isolated operation can be detected even if a frequency change in system cycles is gentle, and the effect (3) means that an isolated operation can be detected even if a frequency of system cycles is changed as being fluctuated and a frequency change in system cycles is gentle.

What is claimed is:

1. An isolated operation detecting method for detecting whether a distributed power supply is cut off from a power system and isolatedly operated or not on the basis of a power fluctuation injected into the power system, comprising:

a first step that injects a power fluctuation into the power system;

a second step that measures a system cycles;

a third step that adjusts the injection of the power fluctuation so that the system cycles increase when the system cycles are found increased than the previous system cycles as a result of the measuring, and decreases when the system cycles are found decreased than the previous system cycles as a result of the measuring;

a fourth step that produces a change pattern of a plurality of latest system cycles based on a plurality of deviations of the plurality of latest system cycles from a fixed number of past previous system cycles by calculating whether each of the deviations between each of the plurality of latest system cycles and each of the fixed number of past previous system cycles exceeds a corresponding one of a plurality of threshold values set for each deviation, and forming the change pattern based on the result of this calculation, and forms an isolated operation determination area from each of the threshold values set corresponding to each of the plurality of latest system cycles; and a fifth step that determines an isolated operation on the basis of the change pattern by judging whether the change pattern formed from the plurality of deviations is within the isolated operation determination area.

2. An isolated operation detecting method according to claim 1, wherein the interval between the latest system cycles and the previous system cycles is fixed.

3. An isolated operation detecting method according to claim 1, wherein the plurality of deviations are the deviations between each of the plurality of latest system cycles and an average value of a fixed number of cycles passed previous system cycles.

4. An isolated operation detecting method according to claim 1, wherein the threshold value is set to be greater for the most latest system cycles.

5. An isolated operation detecting method according to claim 1, wherein in case increased threshold is set, the first threshold value is set to be negative.

6. An isolated operation detecting method according to claim 1, wherein in case decreased threshold is set, the first threshold value is set to be positive.

7. An isolated operation detecting method according to claim 1, wherein an average value of the plurality of latest system cycles is used as each of the latest system cycles.

8. An isolated operation detecting method according to claim 1, wherein the threshold values are set to slowly increase or decrease compared to system cycles.

9. An isolated operation detecting method according to claim 7, wherein each of the threshold values comprises a threshold value determined with a prolonged cycles of more than one latest system cycles.

10. An isolated operation detecting method according to claim 1, wherein the threshold values comprise a set of threshold values for determining a sharp system cycles change during a short cycles period and a set of threshold values for determining a gentle system cycles change during a long cycles period.

11. A control apparatus that controls an operation of an isolated operation detecting apparatus that detects whether a distributed power supply is cut off from a power system and isolatedly operated or not, comprising:
    a first unit that injects a power fluctuation into the power system;
    a second unit that measures a system cycles;
    a third unit that adjusts the injection of the power fluctuation so that the system cycles increase when the system cycles is found increased than the previous system cycles as a result of the measuring, and decreases when the system cycles are found decreased than the previous system cycles as a result of the measuring;
    a fourth unit that produces a change pattern of a plurality of latest system cycles based on a plurality of deviations of the plurality of latest system cycles from a fixed number of past previous system cycles by calculating whether each of the deviations between each of the plurality of latest system cycles and each of the fixed number of past previous system cycles exceeds a corresponding one of a plurality of threshold values set for each deviation, and forming the change pattern based on the result of this calculation, and forming an isolated operation determination area from each of the threshold values set corresponding to each of the plurality of latest system cycles; and
    a fifth unit that determines an isolated operation on the basis of change pattern by judging whether the change pattern formed from the plurality of deviations is within the isolated operation determination area.

12. A control apparatus according to claim 11, wherein the first to the fifth units are distributedly mounted both in the distributed power supply and the isolated operation detecting apparatus.

13. A control apparatus that controls an operation of an isolated operation detecting apparatus that detects whether a distributed power supply is cut off from a power system and isolatedly operated or not, comprising incorporated therein a microcomputer including software program executing the method according to claim 1.

14. An isolated operation detecting apparatus that detects whether a distributed power supply is cut off from a power system and isolatedly operated or not, comprising the control apparatus according to claim 11.

15. A distributed power supply that has incorporated therein an isolated operation detecting apparatus that detects whether a distributed power supply is cut off from a power system and isolatedly operated or not, wherein the isolated operation detecting apparatus comprises the control apparatus according to claim 11.

* * * * *